US007321324B2

(12) United States Patent
Piovaccari

(10) Patent No.: US 7,321,324 B2
(45) Date of Patent: Jan. 22, 2008

(54) UNCONDITIONALLY STABLE ANALOG-TO-DIGITAL CONVERTER

(75) Inventor: Alessandro Piovaccari, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 65 days.

(21) Appl. No.: 11/270,908

(22) Filed: Nov. 10, 2005

(65) Prior Publication Data
US 2007/0001881 A1 Jan. 4, 2007

Related U.S. Application Data

(60) Provisional application No. 60/695,587, filed on Jun. 30, 2005.

(51) Int. Cl.
*H03M 3/00* (2006.01)

(52) U.S. Cl. .................. 341/143; 341/139; 341/155; 375/316

(58) Field of Classification Search .......... 341/143, 341/155; 375/316
See application file for complete search history.

(56) References Cited

U.S. PATENT DOCUMENTS

| 5,012,244 | A | | 4/1991 | Wellard et al. .......... 341/143 |
| 5,055,846 | A | * | 10/1991 | Welland .................. 341/155 |
| 5,243,345 | A | * | 9/1993 | Naus et al. .............. 341/143 |
| 5,248,972 | A | * | 9/1993 | Karema et al. .......... 341/143 |
| 5,719,573 | A | * | 2/1998 | Leung et al. ............. 341/143 |
| 5,736,950 | A | * | 4/1998 | Harris et al. ............. 341/143 |
| 5,742,246 | A | * | 4/1998 | Kuo et al. ................ 341/143 |
| 6,005,506 | A | * | 12/1999 | Bazarjani et al. ........ 341/143 |
| 6,061,009 | A | | 5/2000 | Krone et al. ............. 341/143 |
| 6,516,185 | B1 | * | 2/2003 | MacNally ............... 455/234.1 |
| 6,590,943 | B1 | * | 7/2003 | Ali ......................... 375/332 |
| 6,646,581 | B1 | | 11/2003 | Huang ..................... 341/143 |
| 6,654,594 | B1 | * | 11/2003 | Hughes et al. .......... 455/245.1 |
| 6,888,484 | B2 | * | 5/2005 | Kiss et al. ................ 341/143 |
| 7,151,917 | B2 | * | 12/2006 | Paulus .................... 455/302 |
| 2003/0174641 | A1 | * | 9/2003 | Rahman ................. 370/206 |

OTHER PUBLICATIONS

"A Third-Order Sigma-Delta Modulator for Dual-Mode Receivers" Rusu, A. and Tenhunen, H. Proceedings of the 46th IEEE International Midwest Symposium on Circuits and Systems, 2003. (MWSCAS'03). vol. 1, pp. 68-71. Published Dec. 27-30, 2003.
PCT/US2006/025308 International Search Report with Written Opinion of the International Searching Authority, mailed Nov. 7, 2006.
W. Redman-White, et al., "Integrated Fourth-Order Convertor with Stable Self-Tuning Continuous-Time Noise Shaper," Jun. 1, 1994, pp. 145-150.

* cited by examiner

*Primary Examiner*—Khai M. Nguyen
(74) *Attorney, Agent, or Firm*—Trop, Pruner & Hu, P.C.

(57) ABSTRACT

In one embodiment, the present invention includes a delta-sigma modulator formed of a loop filter coupled to receive an incoming signal, and a quantizer coupled to the loop filter to receive an output of the loop filter and to generate a quantized output. The loop filter may have multiple integration stages and a transfer function constrained to maintain stability of the delta-sigma modulator regardless of an amplitude of the incoming signal. Methods directed to design of such a delta-sigma modulator are also described.

17 Claims, 16 Drawing Sheets

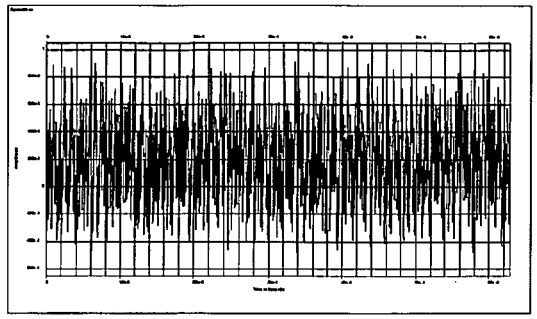
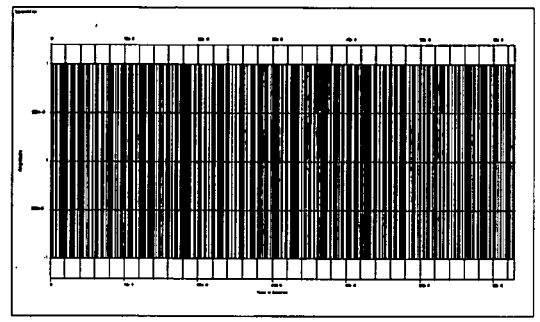
FIG. 5A                FIG. 5B
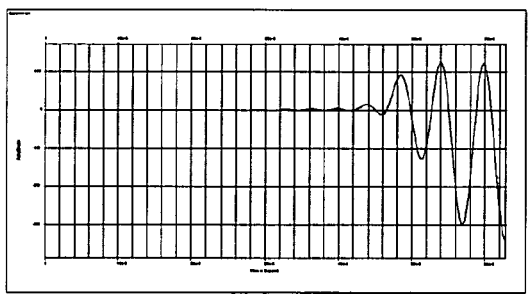
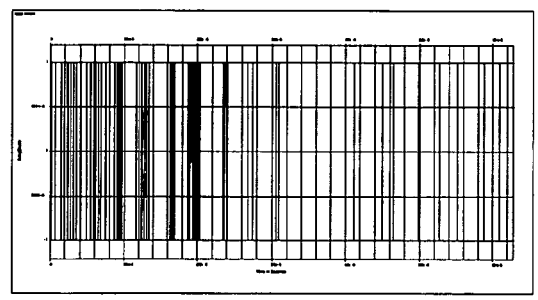
FIG. 5C                FIG. 5D
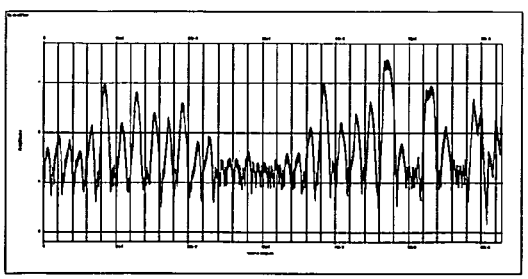
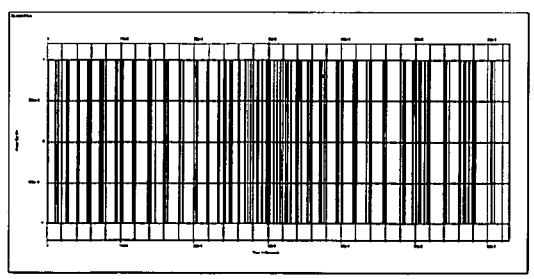
FIG. 5E                FIG. 5F

UNCONDITIONALLY STABLE ANALOG-TO-DIGITAL CONVERTER

This application claims priority to U.S. Provisional Patent Application No. 60/695,587 filed on Jun. 30, 2005 in the name of Alessandro Piovaccari entitled UNCONDITIONALLY STABLE ANALOG-TO-DIGITAL CONVERTER.

FIELD OF THE INVENTION

The present invention relates to an analog-to-digital converter (ADC) and more particularly to a delta-sigma modulator (DSM)-type ADC.

BACKGROUND

Many different techniques are available to perform analog-to-digital (A/D) or digital-to-analog (D/A) conversion. Typical converters for performing A/D conversion operate at levels of at least twice the highest frequency component that is being sampled (known as the Nyquist rate). In addition, many ADCs operate at even higher frequencies, known as oversampling converters. The main advantage of the oversampling technique is the fact that the quantization noise, inherently introduced by the A/D conversion, is spread over a wider bandwidth resulting in a lower noise floor in the band of interest. Moreover, if a lower noise floor is not a requirement, then oversampling the A/D conversion can be performed with lower precision, obtaining the same noise floor in the band of interest. For example, by performing oversampling, the ADC output can be a single bit, completely avoiding the need for precisely tuned components. However, oversampling requires that the oversampled information later be reduced to the Nyquist rate.

Oftentimes, an oversampling ADC is formed using a delta-sigma modulator (DSM), which includes at least an integrator, also referred to as a loop filter, and a comparator, also referred to as a quantizer, connected in a negative feedback configuration to provide quantized outputs. The main advantage of delta-sigma modulation is the shift of the quantization noise from the band of interest to another band, a technique known as noise-shaping. A low-pass filter and a decimator may then be used to eliminate the out-of-band noise and provide a digitized signal at the Nyquist rate. Delta-sigma modulators are often designed using a high-order loop filter, as lower sampling rates can be used to obtain the desired precision. However, at high-orders (typically three and above orders), a non-linear response of the DSM that is fed back to the DSM input can cause instability. This instability is a function of the amplitude and frequency of the incoming signal. While it is oftentimes possible to recover from an instability condition by resetting the modulator to a predetermined state, such operation is time consuming and leads to a potential loss of signal information.

Accordingly, a need exists for improved DSM operation.

SUMMARY

In one aspect, the present invention includes a delta-sigma modulator (DSM) with a loop filter that is coupled to receive an incoming signal and a quantizer coupled to the loop filter to receive an output of the loop filter and to generate a quantized output. The loop filter may have multiple integration stages and may also have a transfer function that is constrained to maintain stability of the delta-sigma modulator regardless of an amplitude and frequency of the incoming signal. In other words, within a given system in which the DSM is located, the DSM has guaranteed stability, regardless of input amplitude or frequency.

Another aspect of the present invention resides in a method for determining a maximum input signal across a frequency spectrum to be provided to an input of a DSM, calculating a maximum signal transfer function peaking value that the DSM can incur without instability, and synthesizing a loop filter of the DSM to limit signal transfer function peaking below the calculated maximum signal transfer function peaking value.

While not limited in this regard, embodiments of the present invention may be implemented in a system such as a broadcast radio receiver, e.g., a continuous time broadcast receiver. Such a system may include, in one embodiment, an analog front-end to receive an incoming radio frequency (RF) signal and an audio-to-digital converter (ADC) having an input coupled to receive the incoming RF signal from the analog front-end. The ADC may include a DSM that is stable at any possible amplitude and frequency of the incoming RF signal. Of course, other implementations are possible.

BRIEF DESCRIPTION OF THE DRAWINGS

FIGS. 5A and 5B are graphical representations of quantizer inputs and DSM outputs for sinusoidal input at $f_{in}$=125 kHz, $V_{in}$=0.3750$V_{FS}$.

FIGS. 5C and 5D are graphical representations of quantizer inputs and DSM outputs for sinusoidal input at $f_{in}$=125 kHz, $V_{in}$=0.6875$V_{FS}$ and unbounded state variables.

FIGS. 5E and 5F are graphical representations of quantizer inputs and DSM outputs for sinusoidal input at $f_{in}$=125 kHz, $V_{in}$=0.6875$V_{FS}$ and limited state variables.

DETAILED DESCRIPTION

In many different systems, a DSM-type of ADC may be a suitable choice for use in a variety of systems. However, as discussed above, such a DSM can become unstable under certain input conditions. While the instability may be resolved in various conventional manners, the presence of any instability is unsuitable for particular applications. For example, in certain wireless devices such as radios for the reception of analog signals and the like, any interruption of service cannot be tolerated. Furthermore, different implementations of such a wireless system perform significant amounts of its signal processing digitally, after conversion from incoming analog signals. Accordingly, an analog front-end is reduced to a minimal portion. Accordingly, this is a particularly suitable architecture for realization in a CMOS technology. Accordingly, various analog signal processing techniques, such as filtering, signal limiting, and the like are typically not applied.

Accordingly, in various embodiments an unconditionally stable DSM may be implemented in an ADC for such a system. In this manner, the DSM never reaches an instability condition in the particular system configuration in which it is used, without placing any particular constraint at its input (i.e., an unconditionally stable DSM). In this way, the analog front-end need not perform any special filtering or other signal processing to develop a signal suitable for input into the DSM. In other words, the stability range of the DSM is not a design constraint of the system. While as will be described herein with regard to a radio receiver, and more particularly a low-intermediate frequency radio receiver, it is to be understood the scope of the present invention is not so limited.

Figure 1A:
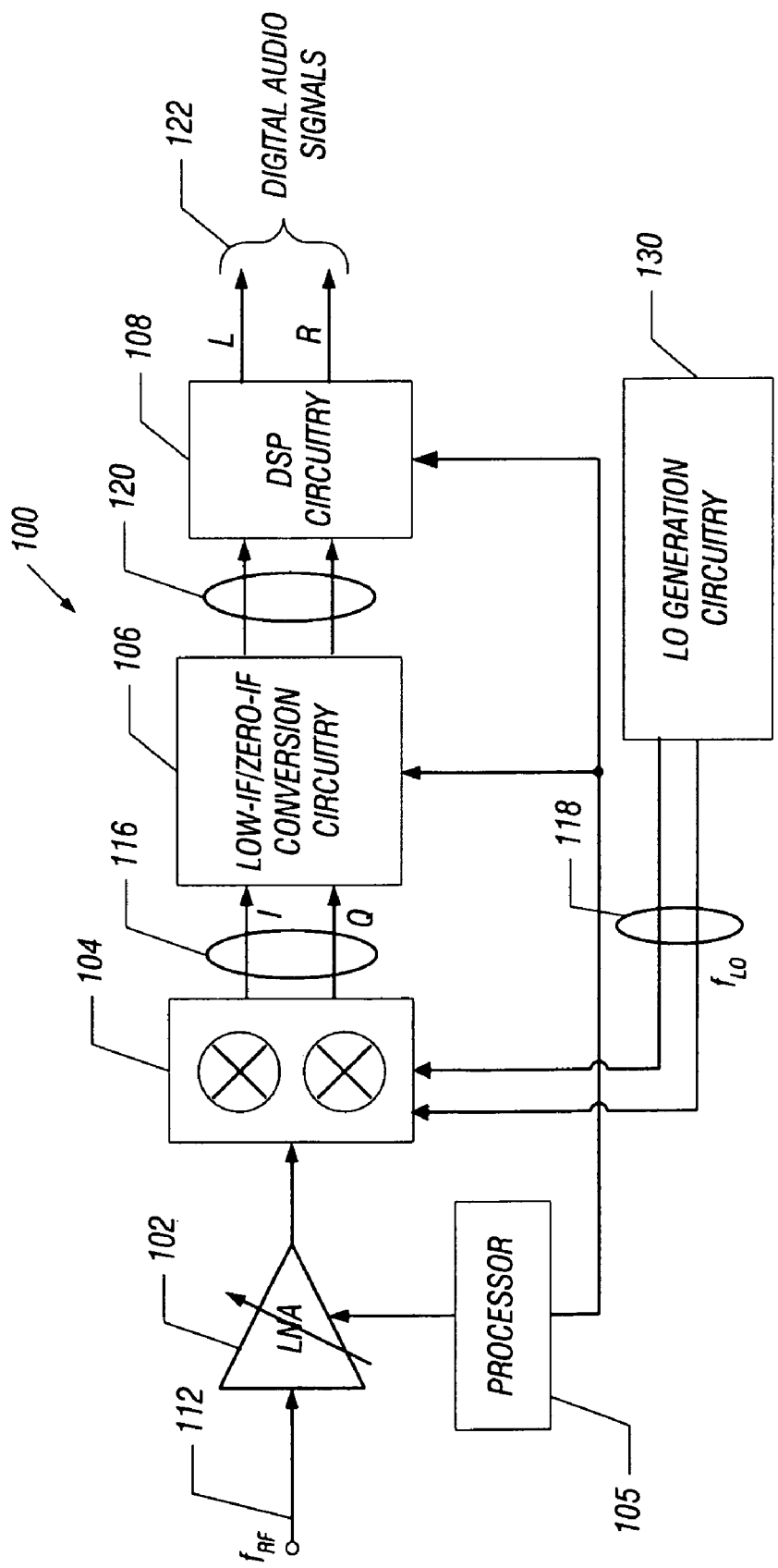
FIG. 1A is a block diagram of an embodiment of an integrated receiver that utilizes a low-IF or direct-conversion architecture.

FIG. 1A is a block diagram of an embodiment 100 for an integrated terrestrial broadcast receiver that utilizes a low-IF or direct-conversion architecture. For the purpose of this discussion the term "low-IF" refers to either low-IF or direct-conversion architectures, as the architectures are conceptually similar and the techniques described herein applicable to both cases. The input signal spectrum ($f_{RF}$) 112 is expected to be a radio frequency (RF) signal spectrum that includes a plurality of channels that can be tuned. It is noted that as used herein, a "radio frequency" or RF signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. More particularly, the embodiments can provide an advantageous architecture for an FM terrestrial broadcast receiver. For purposes of the description below, therefore, the RF signal spectrum ($f_{RF}$) 112 will be discussed primarily with respect to the RF signal spectrum ($f_{RF}$) 112 being an FM terrestrial broadcast spectrum that includes a plurality of different FM broadcasts channels centered at different broadcast frequencies.

Looking back to the embodiment 100 in FIG. 1A, a low noise amplifier (LNA) 102 receives the RF signal spectrum ($f_{RF}$) 112. LNA 102 may be digitally controlled by a processor 105, which may be a microcontroller in some embodiments. Unlike conventional receivers, processor 105 may also be used to perform automatic gain control (AGC) for receiver 100 instead of the AGC being provided by analog circuitry. Processor 105 includes a processing core that executes instructions (stored in a memory, for example, of the processor) for purposes of sensing various gains and other parameters of receiver 100 and controlling LNA 102 (and other portions) of receiver 100 accordingly. In some embodiments of the invention, processor 105 may be a microcontroller, such as a microcontroller based on the 8051 instruction set. However, a processor other than a microcontroller as well as a different type of microcontroller may be used in other embodiments of the invention.

In some embodiments of the invention, processor 105 and components of the RF and IF processing chain (described further below) may be integrated on the same semiconductor die (i.e., substrate) and thus may be part of the same semiconductor package or integrated circuit (IC). In other embodiments of the invention, processor 105 may be part of the same semiconductor package as the components of the RF/IF chain but located on a separate die. In still other embodiments of the invention, processor 105 and RF/IF chain components may be located in different semiconductor packages. Thus, many variations are possible and are within the scope of the appended claims.

Still referring to FIG. 1A, the output of LNA 102 is then applied to a mixer 104, and mixer 104 generates real (I) and imaginary (Q) output signals, as represented by signals 116. To generate these low-IF signals 116, the mixer 104 uses phase shifted local oscillator (LO) mixing signals ($f_{LO}$) 118. For the purpose of this discussion, the term low-IF signals designate either a low-IF or a zero-IF signal, obtained in the low-IF and direct-conversion architectures respectively. The LO generation circuitry 130 includes oscillation circuitry and outputs the two out-of-phase LO mixing signals ($f_{LO}$) 118 that are used by the mixer 104. The outputs of mixer 104 are at a low-IF, which can be designed to be fixed or may be designed to vary, for example, if discrete step tuning is implemented for the LO generation circuitry 130. An example of large step LO generation circuitry that utilizes discrete tuning steps is described in the co-owned and co-pending U.S. patent application Ser. No. 10/412,963, which was filed Apr. 14, 2003, which is entitled "RECEIVER ARCHITECTURES UTILIZING COARSE ANALOG TUNING AND ASSOCIATED METHODS," and which is hereby incorporated by reference in its entirety Low-IF/zero-IF conversion circuitry 106 (referred to herein as "low-IF conversion circuitry 106," for ease of discussion) receives the real (I) and imaginary (Q) signals 116 and outputs real and imaginary digital signals, as represented by signals 120. As shown in FIG. 1A, processor 105 may be coupled to control operation of low-IF circuitry 106. The low-IF conversion circuitry 106 preferably includes band-pass or low-pass analog-to-digital converter (ADC) circuitry that converts the low-IF input signals to the digital domain. Such ADC circuitry may be a DSM-type ADC, as will be discussed further. And the low-IF conversion circuitry 106 provides, in part, analog-to-digital conversion, signal gain and signal filtering functions. Further digital filtering and digital processing circuitry with the digital signal processing (DSP) circuitry 108 is then used to further tune and extract the signal information from the digital signals 120. DSP circuitry 108 may also be controlled by processor 105, as shown in FIG. 1A. The DSP circuitry 108 then produces baseband digital output signals 122.

When the input signals relate to FM broadcasts, this digital processing provided by the DSP circuitry 108 can include, for example, FM demodulation and stereo decoding. Digital output signals 122 can be left (L) and right (R) digital audio output signals 122 that represent the content of the FM broadcast channel being tuned, as depicted in the embodiment 100 of FIG. 1A. It is noted that the output of the receiver 100 can be other desired signals, including, for example, low-IF quadrature I/Q signals from an analog-to-digital converter that are passed through a decimation filter, a baseband signal that has not yet been demodulated, multiplexed L+R and L−R audio signals, L and R analog audio signals, and/or any other desired output signals.

It is noted that as used herein low-IF conversion circuitry refers to circuitry that in part mixes the target channel within the input signal spectrum down to a fixed IF frequency, or down to a variable IF frequency, that is equal to or below about three channel widths. For example, for FM broadcasts within the United States, the channel widths are about 200 kHz. Thus, broadcast channels in the same broadcast area are specified to be at least about 200 kHz apart. For the purposes of this description, therefore, a low-IF frequency for FM broadcasts within the United States would be an IF frequency equal to or below about 600 kHz. It is further noted that for spectrums with non-uniform channel spacings, a low-IF frequency would be equal to or below about three steps in the channel tuning resolution of the receiver circuitry. For example, if the receiver circuitry were configured to tune channels that are at least about 100 kHz apart, a low-IF frequency would be equal to or below about 300 kHz. As noted above, the IF frequency may be fixed at a particular frequency or may vary within a low-IF range of frequencies, depending upon the LO generation circuitry 130 utilized and how it is controlled. In other embodiments, other types of down conversion from RF signals to baseband may be effected.

It is further noted that the architecture of the present invention can be utilized for receiving signals in a wide variety of signal bands, including AM audio broadcasts, FM audio broadcasts, television audio broadcasts, weather channels, television signals, satellite radio signals, global positioning signals (GPS), and other desired broadcasts, among many other signal types.

Figure 1B:
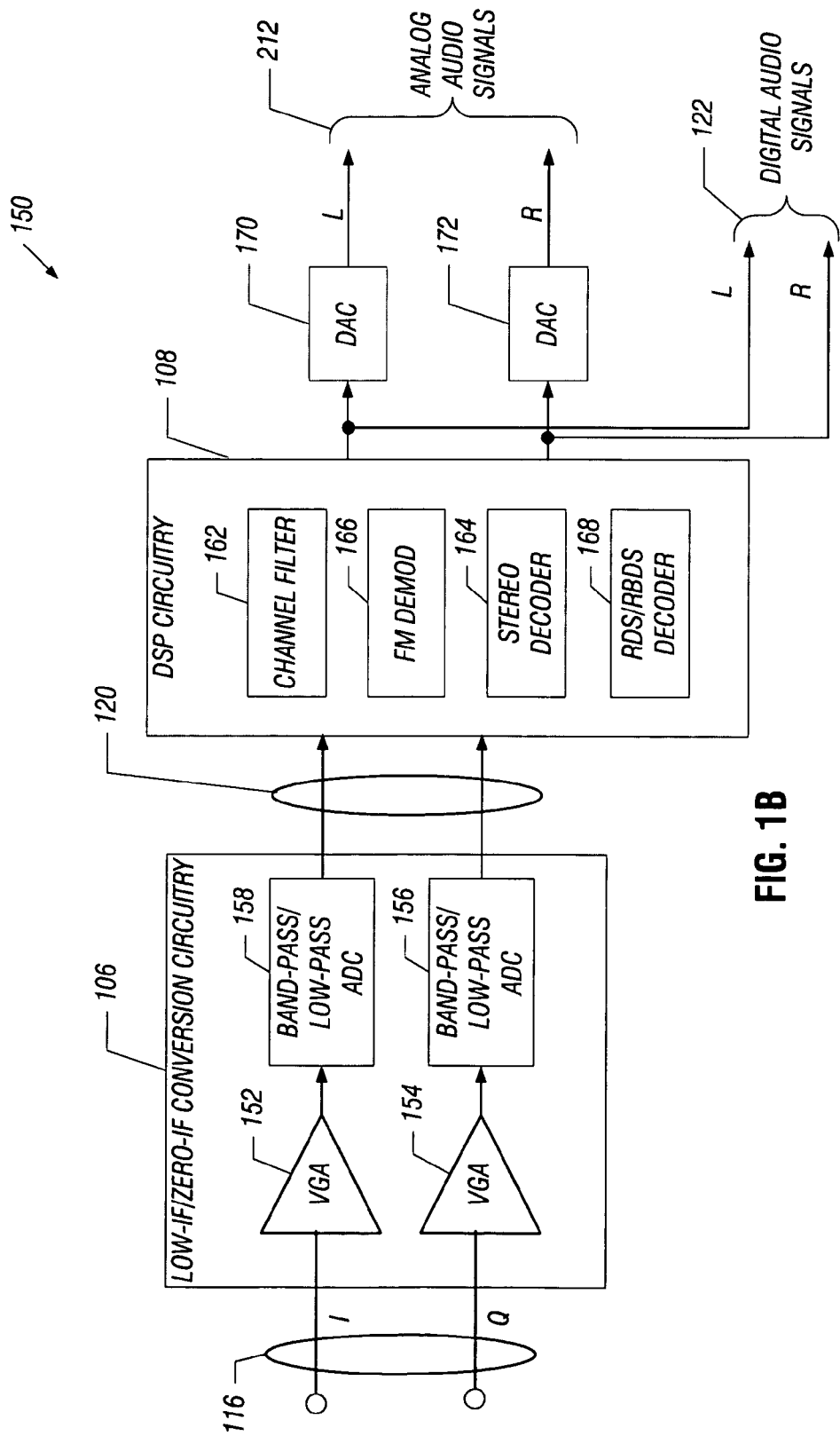
FIG. 1B is a more detailed block diagram for the low-IF (or baseband) conversion circuitry and the DSP circuitry of FIG. 1A.

FIG. 1B is a more detailed block diagram for the low-IF/zero-IF circuitry 106 and the DSP circuitry 108 of FIG. 1A where the receiver circuitry is utilized for an integrated FM terrestrial broadcast receiver. More particularly, in the embodiment 150 of FIG. 1B, the low-IF circuitry 106 includes variable gain amplifiers (VGAs) 152 and 154 that receive the real (I) and imaginary (Q) signals 116 that have been mixed down to a low-IF frequency by mixer 104. The output of VGA 152 is then converted from low-IF to the digital domain using band-pass ADC 158. Similarly, the output of VGA 154 is converted from low-IF to the digital domain using band-pass ADC 156. Together, the ADCs 156 and 158 produce the real (I) and imaginary (Q) digital output signals 120. ADCs 156 and 158 may be low-pass converters, in some embodiments. In some implementations, ADCs 156 and 158 may be combined as a single complex ADC. The DSP circuitry 108 conducts digital processing in the digital domain to further tune the target channel. More particularly, the low-IF DSP circuitry 108 utilizes a channel selection filter, as represented by the channel filter block 162, to further tune the target channel. As indicated above, the DSP circuitry 108 can also implement digital processing to provide FM demodulation of the tuned digital signals, as represented by FM DEMOD block 166, and can implement stereo decoding, such as MPX decoding, as represented by stereo decoder block 164. In addition, embodiment 150 can tune and decode RDS (Radio Data System) and/or RBDS (Radio Broadcast Data System) information utilizing in part the RDS/RBDS decoder 168 within the DSP circuitry 108. The output signals from the low-IF DSP circuitry 108 are left (L) and right (R) digital audio signals 122. If desired, integrated digital-to-analog converters (DACs), such as DACs 170 and 172, can be utilized to convert these digital audio signals to left (L) and right (R) analog audio signals 212. It is also noted that, if desired, ADCs 156 and 158 could also be implemented as complex bandpass ADCs, as real low-pass ADCs, or as any other desired ADC architecture.

As indicated above, the architectures of the present invention are advantageous for small, low-cost portable devices and are particularly advantageous for such devices that need to receive terrestrial audio broadcasts, such as FM broadcasts. In particular, the LO generation circuitry 130, the mixer 104, the low-IF conversion circuitry 106 and the DSP circuitry 108 are preferably all integrated on the same integrated circuit. In addition, the LNA 102 and other desired circuitry can also be integrated into the same integrated circuit. This integrated circuit can be made, for example, using a complementary metal oxide semiconductor (CMOS) process, a BiCMOS process, or any other desired process or combination of processes. In this way, for example, a single integrated circuit can receive a terrestrial broadcast signal spectrum and output digital or analog audio signals related to a tuned terrestrial broadcast channel. Preferably, the integrated circuit is a CMOS integrated circuit, and may be configured to provide advantageous cost, size and performance features for small, portable devices, such as cellular handsets, portable audio devices, MP3 players, portable computing devices, and other small, portable devices.

Power consumption is an additional concern with such small, portable devices. Embodiments of the integrated receiver architecture may advantageously provide for reduced power consumption and allow for the use of power supplies with different ranges to power the integrated receiver. In particular, the present invention allows for low current consumption of less than or equal to 30 mA (milli-Amps) of supply current. In addition, the level of integration provided by embodiments of the present invention allows for a small package size and reduced number of external components.

Figure 1C:
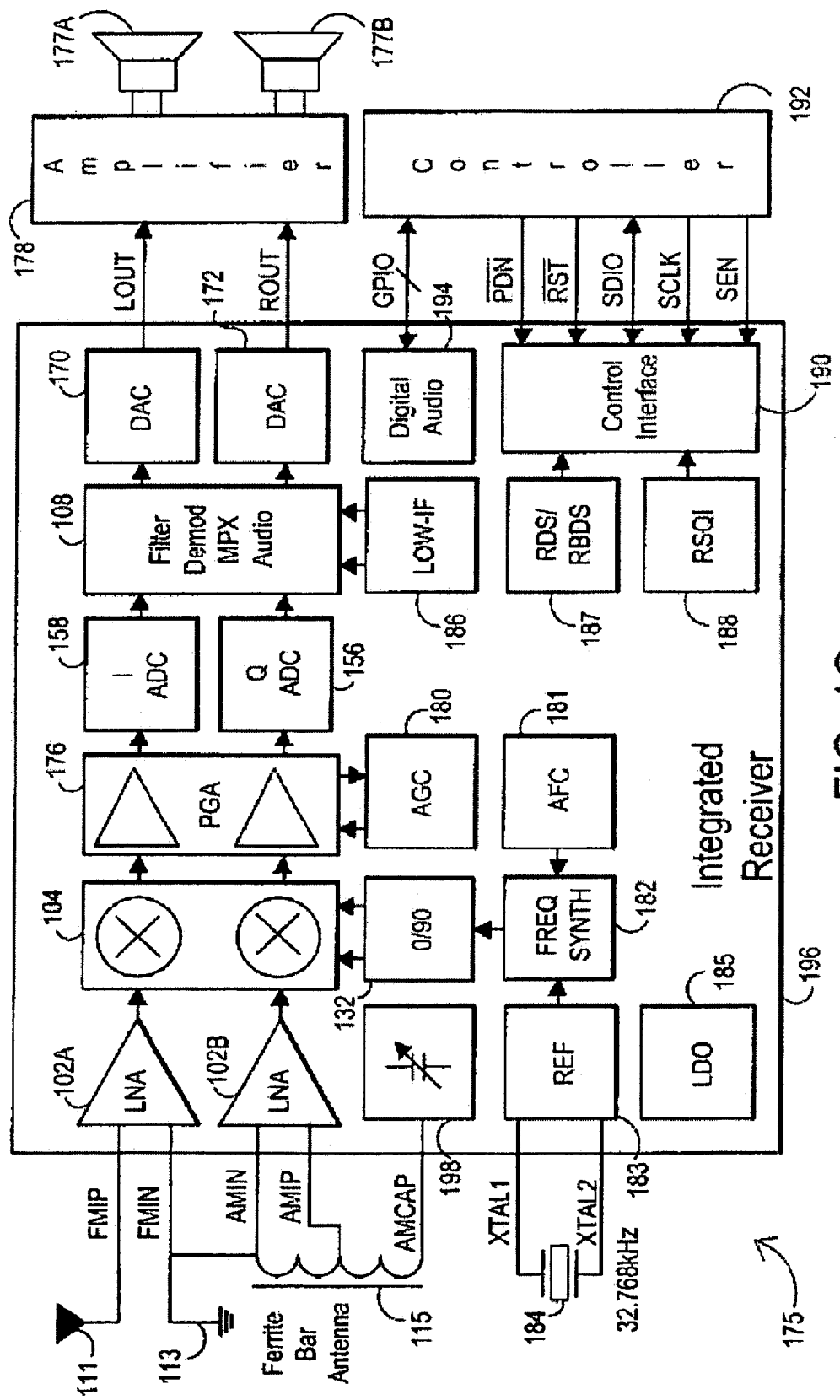
FIG. 1C is a block diagram of one example embodiment of an integrated receiver.

FIG. 1C is a block diagram of one example embodiment 175 for an integrated terrestrial broadcast receiver 196. In the embodiment depicted, the integrated receiver 196 includes an AM antenna and an FM antenna. The FM antenna 111 provides a differential FM input signal, which is represented by signals FMIP (FM input positive) and FMIN (FM input negative), to a first low noise amplifier (LNA) 102A. The FMIN node is coupled to ground 113. The AM antenna 115 provides a differential AM input signal, which is represented by signals AMIP (AM input positive) and AMIN (AM input negative), to a second low noise amplifier (LNA) 102B. While not shown for simplicity in FIG. 1C, it is to be understood that LNA's 102A and 102B may be digitally controlled, as described further herein. The AMIN node is coupled to ground 113. The AM antenna 115, as depicted, is a ferrite bar antenna, and the AM reception can be tuned using an on-chip variable capacitor circuit 198. The connection between the on-chip variable capacitor circuit 198 and the AM antenna 115 is represented by the AMCAP signal. It is also noted that the FM antenna reception can also be tuned with an on-chip variable capacitor circuit, if desired. With respect to the power supply for the integrated receiver 196, an integrated supply regulator (LDO) block 185 can be provided to help regulate the on-chip power.

As with FIG. 1A, the outputs of the LNAs 102A and 102B are processed by mixer 104 to generate real (I) and an imaginary (Q) signals. These signals are the processed by a programmable gain amplifier (PGA) 176, which is controlled by the automatic gain control (AGC) block 180.

The scope of the analog section is to condition the received signal to optimize the SNR at the ADC input. This includes pre-amplification of the received signal amplitude above the receiver noise floor (LNA); frequency translation, from RF to IF (mixer); interferer/blockers reduction through filtering (LPF function of LNA, Mixer and PGA); and gain adjustment to avoid circuit saturation/overloading (AGC).

Figure 2:
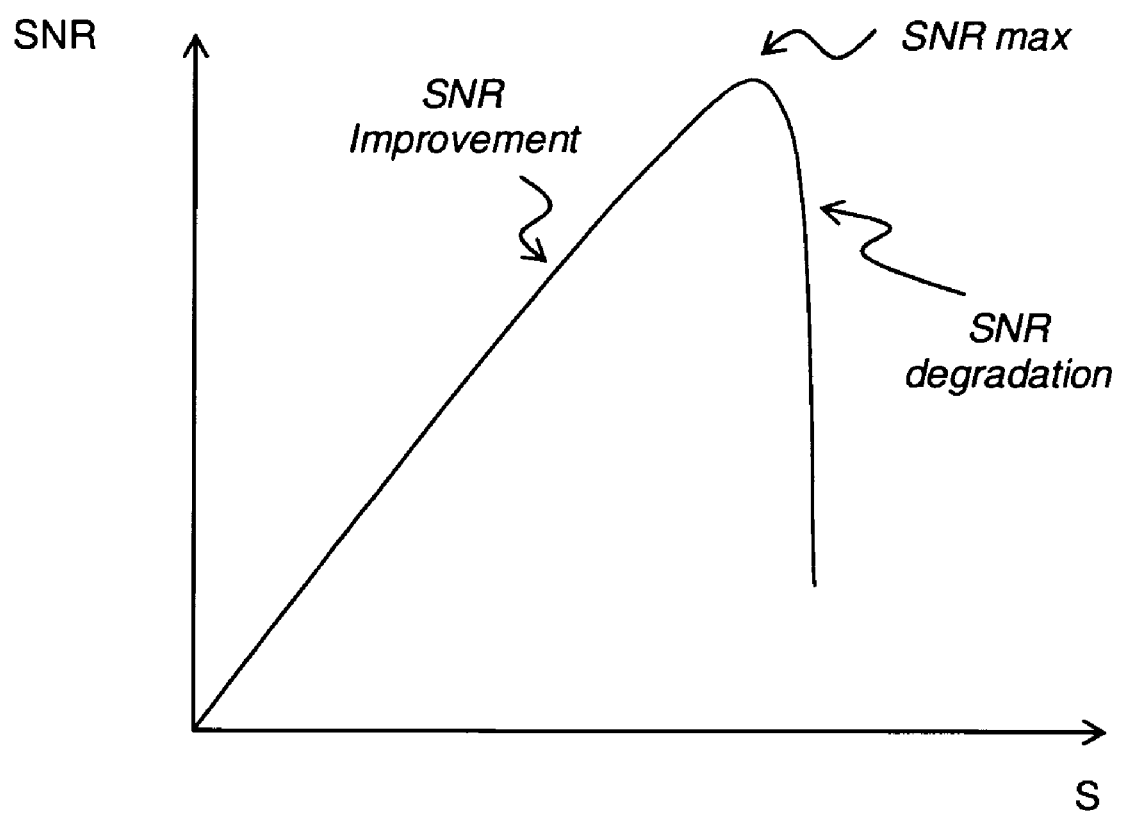
FIG. 2 is a graph representing SNR versus signal level for a given gain setting.

The AGC block 180 performs the gain adjustment in some blocks of the analog front-end such as the PGA and/or the LNA. Thus while not shown for ease of illustration in FIG. 1C, AGC block 180 may be coupled to LNAs 102A and 102B. By so doing, it maximizes the SNR ratio at the ADC input while at the same time avoids any circuit saturation or ADC overload, which can result in a steep degradation of the receiver SNR, as shown in FIG. 2.

The AGC algorithm can use different information to detect the optimal condition for the gain setting including, for example, a RSSI signal coming from an analog peak detector at some point of the analog front-end chain (RSSI$_A$); RSSI information coming from the DSP (RSSI$_D$); and/or OVERLOAD information coming from the ADC.

The output signals from the PGA 176 are then converted to digital I and Q values with I-path ADC 158 and Q-path ADC 156. Again, in some implementations ADCs 156 and 158 may be implemented as a single complex ADC. DSP circuitry 108 then processes the digital I and Q values to produce left (L) and right (R) digital audio output signals that can be provided to the digital audio block 194. In addition, these left (L) and right (R) digital audio output signals can be processed with additional circuitry, as represented by digital-to-analog conversion (DAC) circuits 170 and 172, to produce left (LOUT) and right (ROUT) analog output signals. These analog output signals can then be output to listening devices, such as headphones. Amplifier 178 and speaker outputs 177A and 177B, for example, can represent headphones for listening to the analog audio output signals. As described above with respect to FIG. 1B, the DSP circuitry 108 can provide a variety of processing features, including digital filtering, FM and AM demodulation (DEMOD) and stereo/audio decoding, such as MPX decoding. Low-IF block 186 includes additional circuitry utilized to control the operation of the DSP circuitry 108 in processing the digital I/Q signals.

A digital control interface 190 can also be provided within integrated receiver 196 to communicate with external devices, such as controller 192. As depicted, the digital communication interface includes a power-down (PDN_) input signal, reset (RST_) input signal, a bi-directional serial data input/output (SDIO) signal, a serial clock input (SCLK) signal, and a serial interface enable (SEN) input signal. As part of the digital interface, digital audio block 194 can also output digital audio signals to external devices, such as controller 192. As depicted, this communication is provided through one or more general programmable input/output (GPIO) signals. The GPIO signals represent pins on the integrated receiver 196 that can be user programmed to perform a variety of functions, as desired, depending upon the functionality desired by the user. In addition, a wide variety of control and/or data information can be provided through the interface 190 to and from external devices, such as controller 192. For example, a RDS/RBDS block 187 can report relevant RDS/RBDS data through the control interface 190. And a receive strength quality indicator block (RSQI) 188 can analyze the receive signal and report data concerning the strength of that signal through the control interface 190. It is noted that other communication interfaces could be used, if desired, including serial or parallel interfaces that use synchronous or asynchronous communication protocols.

Looking back to the mixer 104 of FIG. 1C, LO mixing signals are received by mixer 104 from a phase shift block (0/90) 132 that produces two mixing signals that are 90 degrees out of phase with each other. The phase shift block 132 receives an oscillation signal from frequency synthesizer (FREQ SYNTH) 182. Frequency synthesizer 182 receives a reference frequency from reference frequency (REF) block 183 and a control signal from automatic frequency control (AFC) block 181. An external crystal oscillator 184, operating, for example, at 32.768 kHz, provides a fixed reference clock signal to the reference frequency (REF) block 183 through connections XTAL1 and XTAL2. The AFC block 181 can receive tuning error signal from the receive path circuitry within the integrate receiver 196 and provide a correction control signal to the frequency synthesizer 182.

Figure 3:
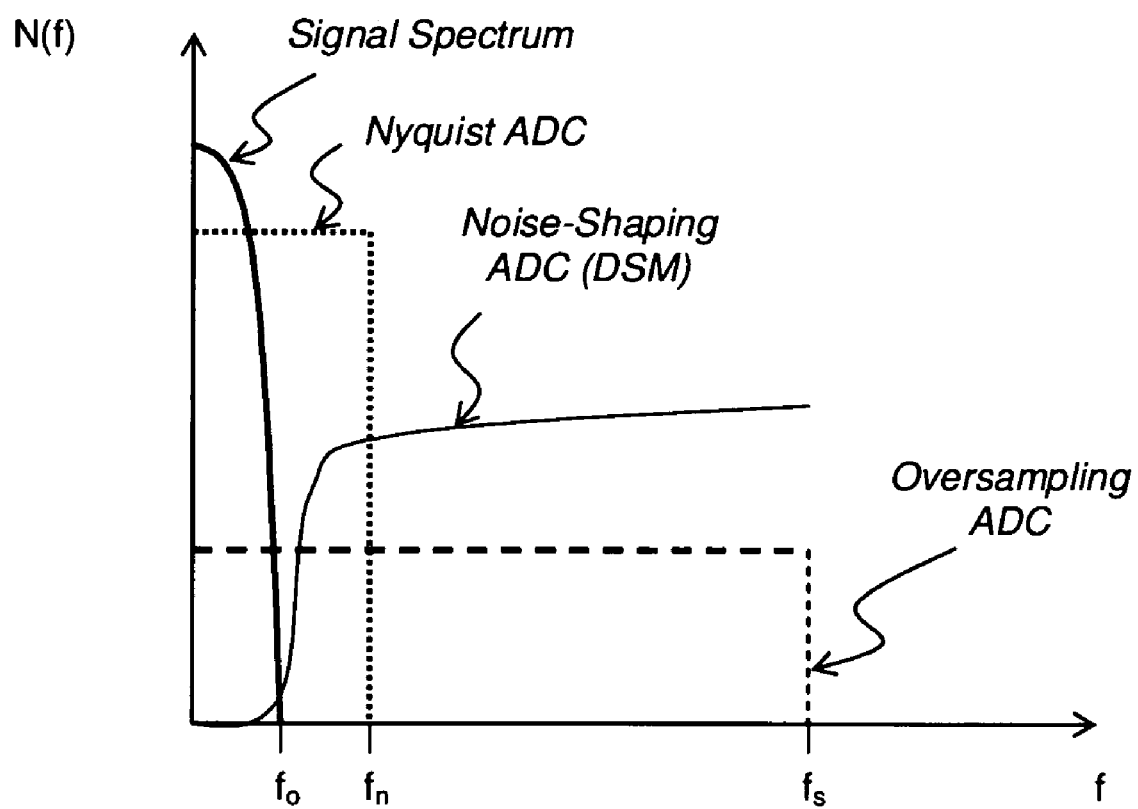
FIG. 3 is a graph representing signal and quantization noise spectrum for different types of analog-to-digital converters.

In such a receiver architecture, the main ADC requirement is a high dynamic range (DR) (i.e., maximum SNR). But the received signal is generally narrowband (100-200 kHz BW), so only high in-band (IB) DR is required. Hence, an appropriate choice for the ADC is to use a DSM, which is a special type of ADC that incorporates both oversampling and noise-shaping techniques. The oversampling spreads the ADC quantization noise power over a bandwidth (BW) wider than signal BW, and the noise-shaping minimizes it in the band of interest (f<f$_o$), i.e., where the wanted signal is located (IB), at the expense of a power gain in the out-of band (OOB) region (f>f$_o$). The OOB noise can be eliminated in the DSP, where a very-high order filter can be more easily implemented. The output noise power of conventional (Nyquist), oversampling and noise-shaping ADCs are qualitatively compared on FIG. 3.

Inside this class of ADCs, particularly attractive for their linearity and insensitivity to component imperfections, are the 1-bit single-loop DSM (the digital output is a single-bit stream) combined with a high-order (e.g., an order greater or equal to 3) loop filter to maximize the noise-shaping function. Such a DSM is referred to as a high-order interpolative DSM. However, the drawback of using a high-order one-bit DSM is that they can exhibit large-amplitude low-frequency oscillations, which correspond to an instable operation.

Figure 4A:
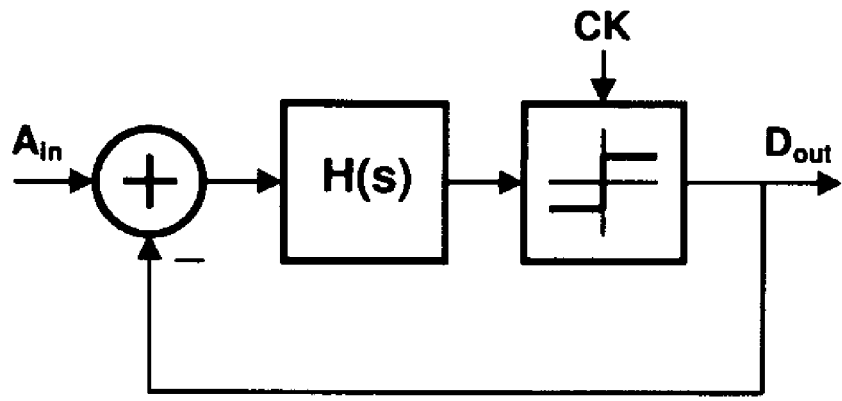
FIG. 4A is a block diagram of a continuous-time DSM in accordance with one embodiment of the present invention.
Figure 4B:
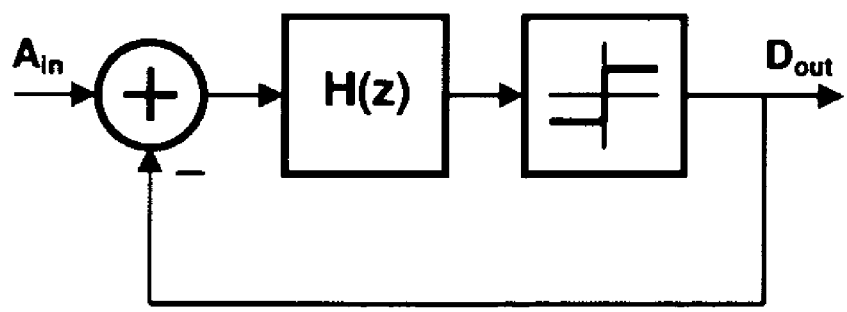
FIG. 4B is a block diagram of a discrete-time DSM in accordance with an embodiment of the present invention.

This DSM, in normal operation, is a feedback system with a highly-selective loop filter and a single hard NL (relay type) given by a 1-bit quantizer. The loop filter can operate either as a continuous-time (CT) or discrete-time (DT) filter, obtaining a CT-DSM or a DT-DSM. FIG. 4A shows a block diagram of a CT-DSM while FIG. 4B shows a block diagram of a DT-DSM. The use of a CT-DSM in a RF application may be preferred for its inherent anti-aliasing function and potentially higher frequency of operation. Nevertheless, it is possible to demonstrate that a CT-DSM is equivalent to an AAF cascaded with a DT-DSM. Thus for purposes of discussion only the DT-DSM is considered, and more specifically a high-order single-loop 1-bit DT-DSM, although the scope of the present invention is not so limited.

The operation of the DSM, as well as the methodology on how to analyze and design the loop filter to obtain a certain STF and NTF is well known. Accordingly, the discussion herein focuses on DSM stability issues.

The operation of such a DSM is difficult to analyze both for the presence of a NL element and the sampling mechanism, which operations interact with each other. A more detailed explanation of the DSM operation and stability analysis is discussed further below.

The dynamic behavior of the DSM is a function of the initial condition of the state variables as well as of the input signal characteristics, more explicitly, peak amplitude and spectrum. The dependency on the initial condition can be eliminated by performing an initial reset. Depending on the architecture and the conditions mentioned above, the DSM output can exhibit an aperiodic behavior or settling on a certain limit cycle (LC). More so, depending on the initial state and input conditions, the behavior of the DSM can be stable (i.e., normal operation) or unstable (i.e., overload condition).

In normal (stable) operation, with zero input signal, this nonlinear (NL) system settles in a stable LC or an aperiodic waveform (still a LC). This LC is necessary for the correct operation of the DSM. The aperiodic behavior is more typical of the high-order DSM where zeros and poles position is generally uncorrelated to the clock frequency. The aperiodic behavior is present when the limit cycle that can be sustained by the feedback loop has a frequency that is irrational with respect to the sampling frequency. In this situation, the sampling of the harmonics generated by the quantizer NL can then generate subharmonics. The cycling through the feedback loop and the presence of the high-order filter, create a very complex spectrum that looks like Gaussian white noise at the quantizer input, normally identified as white noise. Generally, the stable LC has a very long period, and even if its frequency is rationally related to the sampling frequency, the generation of subharmonics is still possible, and the behavior is very similar to the aperiodic case.

In both situations, the state variables and the quantizer input are bounded to a relatively small range, as shown in FIG. 5A, which can be scaled by scaling the coefficients of the loop filter. The output bit stream is highly "randomized" (even if the LC pattern is repeated) and the bit value generally does not repeat for more than 2 times in a row (and occasionally 3 or 4 times), as shown in FIG. 5B. This kind of LC is sensitive to the input magnitude and spectrum distribution. In presence of an input signal, the limit cycle changes its characteristics, and the output bit stream codes the DSM input signal. If the input signal amplitude is limited, the limit cycles are still bounded and the operation of the DSM is stable. As used herein "stable" corresponds to other definitions used in NL control system analysis (like Lyapunov's definition of marginal stability), i.e., for a certain range of the input and for a given initial condition, the state variables remain bounded in a certain region (known as an invariant set).

In this operation, the DSM can be linearized, using the DF approach, obtaining an equivalent model that contains a variable gain, which is a function of the input signal peak amplitude and frequency. This equivalent model represents a conditionally stable system and can be used to analyze the DSM stability.

As explained in detail below, if the input signal amplitude is further increased, the variable gain in linearized model eventually starts to reduce, bringing the DSM to an instability condition. From the linear system theory point of view, this corresponds to an exponentially growing instability of the state variables, as shown in FIG. 5C-FIG. 5D. In this condition the operation of the DSM is unstable. Because the system is actually NL, other behaviors are possible. For instance, stable large amplitude LC can be sustained.

In a real implementation, the growth of the state variables eventually triggers other hard NL's present in the system, for instance the saturation of the operational amplifiers of the loop filter. When these secondary hard NL has come into play, the system is in effect a completely different one from the dynamic behavior point of view, as shown in FIG. 5E-FIG. 5F. A similar effect happens in the presence of large amplitude LCs. With saturation of the state variables, the quasi-linear equivalent model of the DSM has different poles as the order of the loop filter is somehow reduced because of the saturation of some filter stages.

Hence, in both cases, LCs still exist, but they are quite different in nature from the wanted ones, as (some of) the state variables reach the hard limits and become independent from the DSM input signal. Of course, this does not mean that if the input signal drops below a certain value, the DSM cannot recover to a normal stable operation.

The effect of the state variable limiting results in a large and rapid increase of the IB quantization noise, due to a failure of the noise shaping mechanism, and eventually results in a sustained LC that cannot be controlled by the input. So the unwanted operation of the DSM is considered unstable. As can be seen from FIG. 5D-FIG. 5F, these LCs are characterized by longer run-length (i.e., repetition of the same bit value of several identical consecutive bits) of the output. In practice, a sequence of 5-6 or more identical bits may occur.

Thus, differently from a Nyquist ADC, the useful range of the DSM input is not the whole full-scale but a somewhat limited one, dependent on the DSM architecture. The presence of state variable saturation has the advantage of extending the range of stability of the DSM. In particular, the system can recover from relatively short transients of state variables peaks. Moreover, dependent on the architecture of the DSM and characteristics of the secondary NL's, once the input signal is lowered, the system can or cannot recover from unstable operation back to stable operation. If no recovery is possible, a reset of the DSM state variables is performed.

Because for certain amplitudes the DSM can go unstable, the AGC is controlled to set the gain to ensure that the unstable behavior (overloading) is not reached in normal operation. Nevertheless, in a mobile environment a device including a DSM is subject to phenomena like short-term fading, where the signal received can instantaneously reach small and high peaks for a short period of time. Generally, the duration is much smaller than the AGC time constant, making it difficult or impossible for a gain adjustment. The consequence is an overloading of the DSM and an interruption of the received signal, with a recovery time that depends on whether the DSM needs to be reset or not.

As mentioned above, the unstable limit cycles are characterized by longer run-length (i.e., repetition of the same bit value of several (e.g., 5-6 or more) consecutive bits) of the output. So, this situation is easily detectable in the digital domain with a simple counter that flags an overload condition when the preset maximum run-length is reached. If the DSM is not able to autorecover from an unstable operation when the signal level reduces, the overload flag can be used to perform a reset of the DSM state variables.

If the transmitted signal comes in packets, like in a digital cellular environment, short-term fading can result in the loss of some packets. If appropriate coding and interleaving are used, most of the time the error can be corrected. In the worst case, however, the packet may need to be retransmitted. Thus the loss of packet condition may be detected, to be able to reset the DSM or trigger the re-transmission, but the problem is not catastrophic.

Conversely, the short-term fading condition can be a significant problem in a mobile environment where the signal to be received is transmitted continuously, like in conventional radio broadcasting. In fact, if the signal is transmitted continuously, like in the case of FM broadcasting, this error is audible and can be considered not tolerable. Hence, in this case the DSM may be controlled to avoid unstable operation, even if a reduction of the SNR occurs.

In various embodiments, a DSM may be designed that never reaches the unstable operation for every possible input signal level. The following discussion describes analysis of the stability of the DSM in depth in order to obtain design criteria.

Most of the known proposed stability analyses are empirical (i.e., based on the simulation of large number of systems) or based on a linearized model. Several DSM linearization approaches have been proposed with different degrees of sophistication. These models include a linear model with an uncorrelated Gaussian white noise source added to model the quantization noise. However, this model cannot explain stability. A linear model with the quantizer represented by a variable gain plus an uncorrelated Gaussian white noise source is also used. Different approaches on how to determine the gain of the quantizer have been proposed, including the use of the DF. The model has an approximate value, but there is a wide range of conditions for which the linearized model is stable and the NL system is not, and there are also unstable conditions of the linear system that correspond to stable conditions in the NL system. Further, a linear model with the quantizer represented by two variable gains (one for the "noise" and one for the mean value) plus an input-correlated noise source is used. This gives the better estimation of the stability of the system for DC and IB sinusoidal signals, but does not explain resonance phenomena.

In various embodiments, the latter approach may be used and extended to explain resonance phenomena. In addition, it is also given a justification on why, even if the system is deterministic, the quantization effect may be considered as noise. Finally a design methodology to avoid instability is discussed.

In the following analysis s(k) represents a sampled signal, while S(z) represents its z-transform.

Figure 6A:
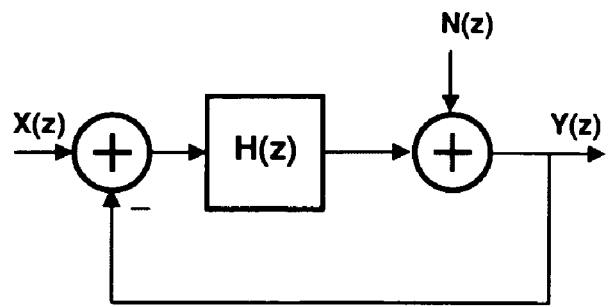
FIGS. 6A-6D are block diagrams of various linear models of DSMs.

FIG. 6A shows the simplest linear model for the DSM, where the quantizer is modeled with an additive uncorrelated Gaussian white noise source N. With this approximation, the signal transfer function (STF) and noise transfer function (NTF) of the DSM can be defined as:

$$NTF(z) = \frac{1}{1 + H(z)} \quad [\text{Eq. 1}]$$

$$STF(z) = \frac{H(z)}{1 + H(z)} = H(z) \cdot NTF(z) \quad [\text{Eq. 2}]$$

Thus, the output is then given by:

$$Y(z) = STF(z) \cdot X(z) + NTF(z) \cdot N(z) \quad [\text{Eq. 3}]$$

This model explains noise shaping but does not model correctly the loop gain even for zero-input signal. This has two problems. First, it looks like the noise can be reduced by scaling the loop gain H(z) and this is experimentally proven wrong. Second, it cannot explain stability.

Figure 6B:
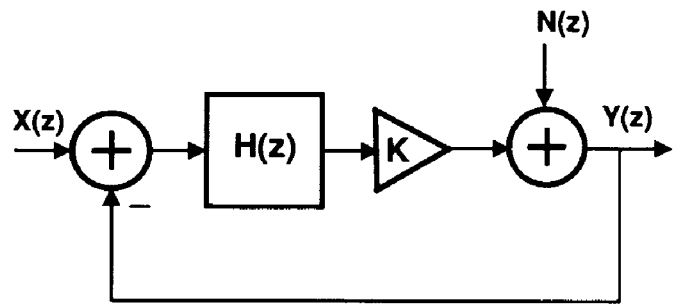

An improved model can be obtained by introducing a variable gain in the loop, as shown in FIG. 6B, such that the quantizer is now modeled as a variable linear gain K and an uncorrelated Gaussian white noise source N(z). With this approximation the STF and NTF are:

$$NTF_K(z) = \frac{1}{1 + K \cdot H(z)} \quad [\text{Eq. 4}]$$

$$STF_K(z) = \frac{K \cdot H(z)}{1 + K \cdot H(z)} = K \cdot H(z) \cdot NTF(z) \quad [\text{Eq. 5}]$$

They vary with the value of K. Thus, the output is then given by:

$$Y(z) = STF_K(z) \cdot X(z) + NTF_K(z) \cdot N(z) \quad [\text{Eq. 6}]$$

Different approaches on how to determine the gain of the quantizer have been proposed. The method used determines the quality of the model. The best approach is to model the quantizer gain by using its describing function (DF):

$$K = N(a) = \frac{4\Delta}{a \cdot \pi} \quad (\text{Eq. 7})$$

where $2\Delta$ is the quantizer step and $\alpha$ is the amplitude of a sinusoid at its input.

The use of the DF preserves the invariance of the NTF. In fact, as the loop filter gain H(z) is scaled by a factor $\alpha$, the same factor scales the quantizer input amplitude that now becomes aa such that the DF is scaled by $1/\alpha$.

Moreover, quantizer gain is a function of the input signal and it is shown to reduce in value as the DC value of the input signal increases. Then the system is conditionally stable, as its stability margin reduces by reducing the value of the quantizer gain K. At this point, the stability can be analyzed and the PM and GM determined using one of several methods. Nyquist plots are the most appropriate. The root locus method is only valid on the stability circle, and the DF theory is valid only for steady-state solutions (but its use can be extended to a neighborhood of the stability circle to analyze the stability of the LC itself). Particular attention may be taken if Bode diagrams are used to determine the PM or GM, as this method is generally more useful for systems where stability improves by reducing K.

Using the Nyquist plots one can determine amplitude and frequency of the oscillation. The oscillation condition is:

$$1 + H(e^{jwT}) \cdot N(a) = 0 \Rightarrow H(e^{jwT}) = \frac{1}{N(a)} \quad [\text{Eq. 8}]$$

Figure 7:
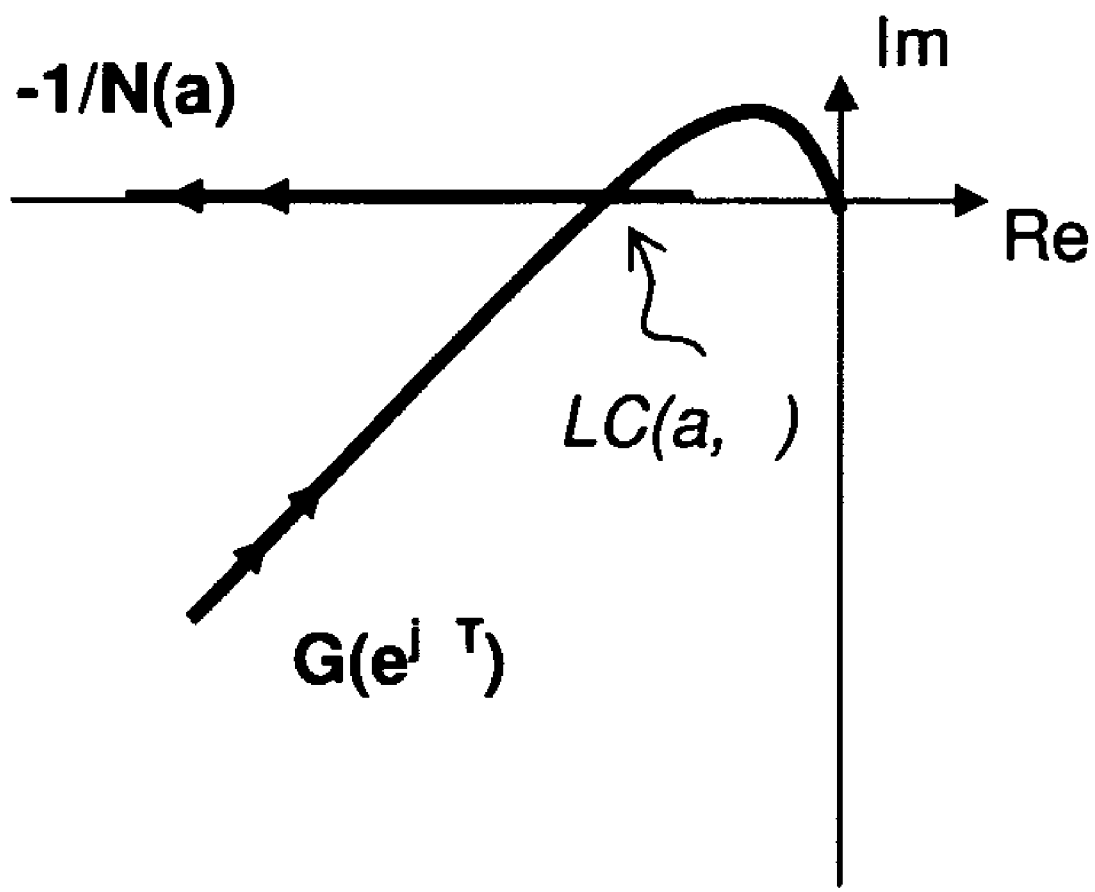
FIG. 7 is a graphical representation of an application of the Nyquist criterion.

Thus the Nyquist criterion is applied with respect to $-1/N(a)$ instead of $-1$. A graphical interpretation is shown in FIG. 7, where the arrows show the direction for the increasing parameter.

However, from the stability point of view, the model is only an approximation. It can be shown experimentally or by simulation that there is a wide range of conditions for which the linearized model is stable and the NL system is not, and there are also unstable conditions for the linear system that correspond to stable conditions in the NL system.

Figure 6C:
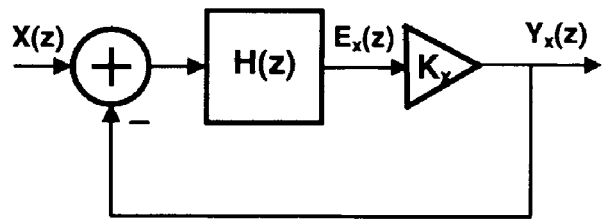
Figure 6D:
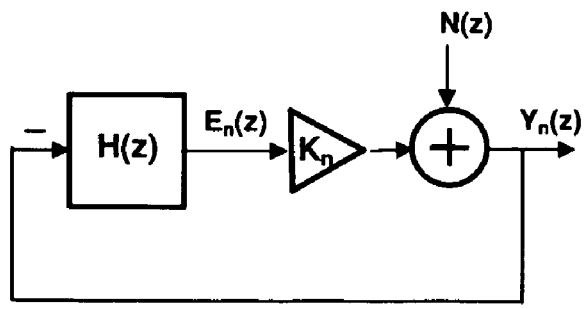
Figure 8:
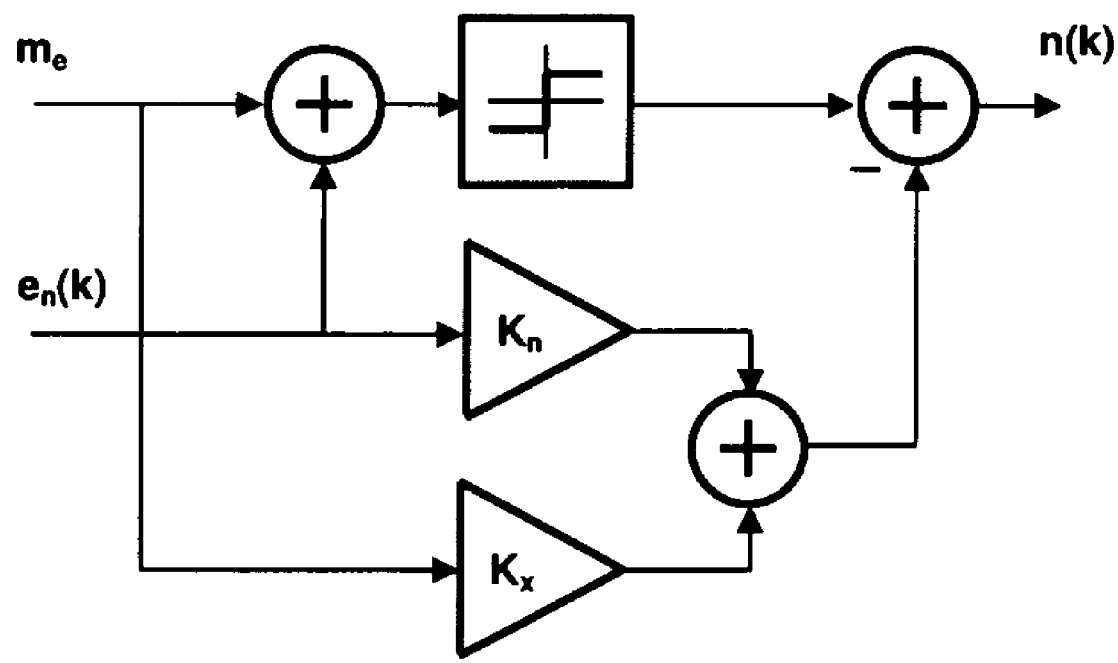
FIG. 8 is a block diagram of a modeled quantizer as a multiple-input DF by using the method of minimization of the MSE.

A more sophisticated linear model is shown in FIG. 6C-FIG. 6D. Assuming that the input of the DSM is a constant DC signal (x(k)=$m_x$), the signal at the quantizer input e(k) is assumed to be the superimposition of a white noise $e_n$(k) and a bias signal $m_e$, which are orthogonal to each other. The quantizer is then the modeled with two gains, one for the average value or bias and one for the variance of the noise, plus an additive noise source. The two gains $K_x$ and $K_n$ can be determined as a multiple-input DF by using the method of minimization of the MSE, as shown in FIG. 8.

With this approximation the STF and NTF of the DSM can be defined as:

$$NTF_{K_n}(z) = \frac{1}{1 + K_n \cdot H(z)} \quad [\text{Eq. 9}]$$

$$STF_{K_x}(z) = \frac{K_x \cdot H(z)}{1 + K_x \cdot H(z)} \quad [\text{Eq. 10}]$$

They vary with the value of K. Thus, the output is then given by:

$$Y(z) = STF_{K_x}(z) \cdot X(z) + NTF_{K_n}(z) \cdot N(z) \quad [\text{Eq. 11}]$$

Because of the high order of the filter, the white noise $e_n$(k) can be assumed Gaussian with PDF:

$$p(e_n) = \frac{1}{\sqrt{2\pi} \cdot \sigma_e} e^{-\frac{e_n^2}{2\sigma_e^2}} \quad [\text{Eq. 12}]$$

In this case, if 2Δ is the 1-bit quantizer step, it can be shown that:

$$K_n = \frac{2\Delta}{\sqrt{2\pi} \cdot \sigma_e} e^{-\frac{m_e^2}{2\sigma_e^2}} \quad [\text{Eq. 13}]$$

$$K_x = \frac{\Delta}{m_e} \text{erf}\left(\frac{m_e}{\sqrt{2} \cdot \sigma_e}\right) \quad [\text{Eq. 14}]$$

Now, if one assumes that for DC the STF(z)~1, assumption justified by the high value of the IB loop gain, it is also true that:

$$m_y \approx m_x \quad [\text{Eq. 15}]$$

$$K_x = \frac{m_x}{m_e} \quad [\text{Eq. 16}]$$

Hence, by defining the following relative quantities:

$$\rho_e = \frac{m_e}{\sqrt{2} \cdot \sigma_e} \quad [\text{Eq. 17}]$$

$$\rho_x = \frac{m_x}{\Delta} \quad [\text{Eq. 18}]$$

We have:

$$\rho_e = \text{erf}^{-1}(\rho_x) \quad [\text{Eq. 19}]$$

$$K_n = \sqrt{\frac{2}{\pi}} \cdot \frac{\Delta}{\sigma_e} e^{-\rho_e^2} \quad [\text{Eq. 20}]$$

$$K_x = \frac{\Delta}{m_e} \text{erf}(\rho_e) \quad [\text{Eq. 21}]$$

Regarding the calculation of the NTF, it may be shown that it is invariant to filter scaling. In fact, both $K_n$ and $K_x$ are divided by the respective input signal value.

Regarding the dependence on the DSM input signal amplitude, as $m_x \to \Delta$, $\rho_e$ becomes very large, and by consequence $K_n$ drops very fast, much faster than $K_x$. So, it is the compression of $K_n$ that governs the instability of the system, as it can be seen analyzing the equivalent conditionally stable system. Unfortunately, as discussed before, the range of stability by varying $\rho_x$ is different for the linearized model and the real NL system. The reason lays on the invalidity of the filter hypothesis generally used in DF analysis, which states that the harmonic of the limit cycle oscillation is filtered by the loop filter, because the distortion products produced by the NL can fall in the IB range of the spectrum.

These extra distortion terms are the components of the quantizer output that are not linearly related (or more precisely they are orthogonal) to the quantizer input. There is nothing else that the leftover error n(k) of the MSE minimization process of FIG. 8. So, these components may be added to the output of the linearized model, as shown in FIG. 6D, to predict the DSM behavior correctly.

Note that, even if the distortion terms are uncorrelated with the quantizer input, they actually still depend on the DSM input level $\rho_x$ and n(k) and cannot be considered a statistically independent source, as it is traditionally accepted.

In this regard, the DSM output bit stream is:

$$p(k) = e_n(k) \cdot K_n + n(k) + m_e \cdot K_x \quad [\text{Eq. 22}]$$

Because $e_n$(k) and n(k) are uncorrelated, and the output bit stream power is constrained to be $\Delta^2$, it results that:

$$\Delta^2 = \sigma_e^2 \cdot K_n^2 + \sigma_n^2 + m_x^2 \quad [\text{Eq. 23}]$$

Then the relation of the added noise to the DSM input can be established:

$$\sigma_n^2 = \Delta^2 \cdot \left[1 - \rho_x^2 - \frac{2}{\pi} e^{-2\left(\text{erf}^{-1}\rho_x\right)^2}\right] \quad [\text{Eq. 24}]$$

This means that as $m_x \to \Delta$, not only the quantizer noise gain $K_n$ reduces, but also the added noise $\sigma_n^2$ reduces, and this is to be taken into account in the analysis. First of all, the output (shaped) noise is then a function of the DSM input amplitude, and in particular it can be seen that by increasing the DSM input amplitude, the noise moves toward the IB region:

$$\sigma_y^2 = |NTF_{K_n}(z)|^2 \cdot \sigma_n^2 = \frac{\sigma_n^2(\rho_x)}{|1 + K_n(\rho_x) \cdot H(z)|^2} = \sigma_y^2(\rho_x) \quad [\text{Eq. 25}]$$

Moreover the stability is itself a function of the DSM input level: its margin reduces as the DSM input level increases and eventually the system becomes unstable.

The model described here can be generalized to different kinds of noise statistics, by referring the analysis to the DSM output instead of its input. This can be obtained by linearizing the quantizer using the correlation method to find its DF, i.e., as the ratio between the covariance between output and input and the input variance:

$$K_n = \frac{R_{ye}(0)}{R_{ee}(0)} = \frac{\text{cov}\{e(k), y(k)\}}{\sigma_e^2} \quad \text{[Eq. 26]}$$

Note that with this definition no hypothesis on the statistics of the noise has been made. The quantization noise is still represented by the leftover distortion components of the linearization process and can be found from the output bit stream as before:

$$\sigma_e^2 \cdot K_n^2 + \sigma_n^2 = \sigma_y^2 = \Delta^2 - m_y^2 \quad \text{[Eq. 27]}$$

And then:

$$\sigma_n^2 = \Delta^2 - m_y^2 - \frac{\text{cov}\{e(k), y(k)\}}{\sigma_e^2} \quad \text{[Eq. 28]}$$

Several PDFs can now be used for the noise at the quantizer input, such as Gaussian, uniform or triangular. Once the PDF is chosen, the value of $m_e$ can be determined as the value of $m_y$ that satisfies the following equation:

$$m_y = \text{prob}\{e(k) > 0\} - \text{prob}\{e(k) < 0\} \quad \text{[Eq. 29]}$$

Figure 9A:
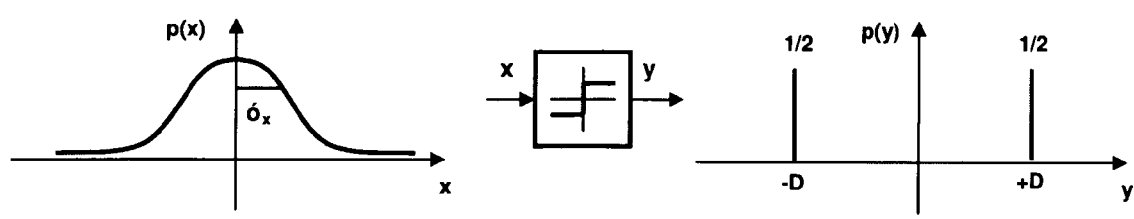
FIGS. 9A and 9B are graphs representing quantizer signal transfer curve derivations in accordance with one embodiment of the present invention.

Note that this method for Gaussian PDF gives the same result as before for $K_x$, as is shown in FIG. 9A. For zero input, the PDF is given by:

$$p(e_n) = \frac{1}{\sqrt{2\pi} \cdot \sigma_e} e^{-\frac{e_n^2}{2\sigma_e^2}} \quad \text{[Eq. 30]}$$

The output can assume only two values, $\pm\Delta$, and because of the symmetric distribution of the input around zero, both values have the same probability:

$$\text{prob}\{-\Delta\} = \text{prob}\{+\Delta\} = \frac{1}{2} \quad \text{[Eq. 31]}$$

Hence, the DC value of the output is zero:

$$m_y = E\{y(k)\} = -\Delta \cdot \text{prob}\{-\Delta\} + \Delta \cdot \text{prob}\{+\Delta\} = -\Delta/2 + \Delta/2 =$$

For non-zero input, the PDF is given by:

$$p(e_n - m_e) = \frac{1}{\sqrt{2\pi} \cdot \sigma_e} e^{-\frac{(e_n - m_e)^2}{2\sigma_e^2}} \quad \text{[Eq. 33]}$$

Figure 9B:
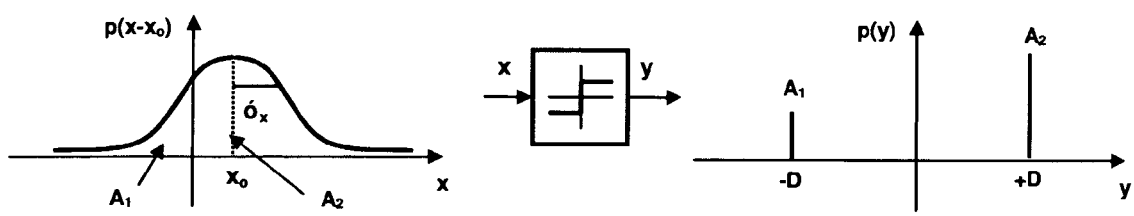

In this condition, the output can still assume only two values, $\pm\Delta$, but because of the asymmetry of the input distribution around zero as shown in FIG. 9B, the two values have different probabilities, equal to the area under p(x) at the left and right size of zero, respectively:

$$\text{prob}\{-\Delta\} = \int_{-\infty}^{0} p(e_n - m_e) de_n = \frac{1}{2} - \frac{1}{2}\text{erf}\left(\frac{m_e}{\sqrt{2} \cdot \sigma_e}\right) \quad \text{[Eq. 34]}$$

$$\text{prob}\{+\Delta\} = \int_{0}^{+\infty} p(e_n - m_e) de_n = \frac{1}{2} + \frac{1}{2}\text{erf}\left(\frac{m_e}{\sqrt{2} \cdot \sigma_e}\right) \quad \text{[Eq. 35]}$$

Hence, the DC value of the output, and the linearized DC gain are given by:

$$m_y = E\{y(k)\} \quad \text{[Eq. 36]}$$
$$= -\Delta \cdot \text{prob}\{-\Delta\} + \Delta \cdot \text{prob}\{+\Delta\}$$
$$= \Delta \cdot \text{erf}\left(\frac{m_e}{\sqrt{2} \cdot \sigma_e}\right)$$

$$K_x = \frac{\Delta}{m_e} \cdot \text{erf}\left(\frac{m_e}{\sqrt{2} \cdot \sigma_e}\right) \quad \text{[Eq. 37]}$$

This is consistent with the previous findings. For $K_n$ the covariance definition may be applied:

$$K_n = \frac{\text{cov}\{e(k), y(k)\}}{\sigma_e^2} = \frac{1}{\sigma_e^2} \int_{-\infty}^{\infty} e_n N(e_n + m_e) p(e_n) de_n \quad \text{[Eq. 38]}$$

With a similar procedure used for $K_x$ again we find a result consistent with the previous findings:

$$K_n = \sqrt{\frac{2}{\pi}} \frac{\Delta}{\sigma_e} \int_{m_e}^{\infty} \frac{e_n}{\sigma_e^2} e^{-\frac{e_n^2}{2\sigma_e^2}} de_n = \sqrt{\frac{2}{\pi}} \frac{\Delta}{\sigma_e} e^{-\rho_e^2} \quad \text{[Eq. 39]}$$

The method described above can be extended to the case of a sinusoidal input. In that case, the linearization is more complicated because the input of the quantizer is now the superimposition of two varying signals and the application of the MSE minimization is held to 2-dimensional statistics. In general, it can be proven that:

$$K_n = \sqrt{\frac{2}{\pi}} \frac{\Delta}{\sigma_e} M\left(\frac{1}{2}, 1, -\rho_{se}^2\right) = \sqrt{\frac{2}{\pi}} \frac{\Delta}{\sigma_e} e^{-\frac{\rho_{se}^2}{2}} I_0\left(\frac{\rho_{se}^2}{2}\right) \quad \text{[Eq. 40]}$$

$$K_x = \sqrt{\frac{2}{\pi}} \frac{\Delta}{\sigma_e} M\left(\frac{1}{2}, 2, -\rho_{se}^2\right) \quad \text{[Eq. 41]}$$

$$\sigma_n^2 = \Delta^2 \cdot \left[i - \frac{\rho_{sx}^2}{2} - \frac{2}{\pi} e^{-\text{erf}^{-1}\rho_{sx}} I_0\left(\frac{\text{erf}^{-1}\rho_{sx}}{2}\right)\right] \quad \text{[Eq. 42]}$$

where M(a,b,x) is called a confluent hypergeometric function. $I_0(x)$ is the modified Bessel function of the first kind order 0, and:

$$\rho_{sx} = \frac{a_x}{\Delta} \quad \text{[Eq. 43]}$$

-continued $$\rho_{se} = \frac{a_e}{\sqrt{2} \cdot \sigma_e} \quad \text{[Eq. 44]}$$

where $\alpha_e$ and $\alpha_x$ are the peak amplitude of the sinusoidal component at the quantizer input and DSM input. Moreover if instead of the peak value of the sinusoid, we consider the RMS value:

$$\rho_{sx,rms} = \frac{a_{x,rms}}{\Delta} = \frac{a_x}{\sqrt{2}\,\Delta} \quad \text{[Eq. 45]}$$

$$\rho_{se} = \frac{a_{e,rms}}{\sqrt{2} \cdot \sigma_e} = \frac{a_e}{2 \cdot \sigma_e} \quad \text{[Eq. 46]}$$

then we get:

$$K_n = \sqrt{\frac{2}{\pi}} \frac{\Delta}{\sigma_e} e^{-\rho_{se,rms}^2} I_0(\rho_{se,rms}^2) \quad \text{[Eq. 47]}$$

$$\sigma_n^2 = \Delta^2 \cdot \left[ 1 - \rho_{sx,rms}^2 - \frac{2}{\pi} \left[ e^{-(\text{erf}^{-1}\rho_{sx,rms})^2} I_0((\text{erf}^{-1}\rho_{sx,rms})^2) \right]^2 \right] \quad \text{[Eq. 48]}$$

Figure 10A:
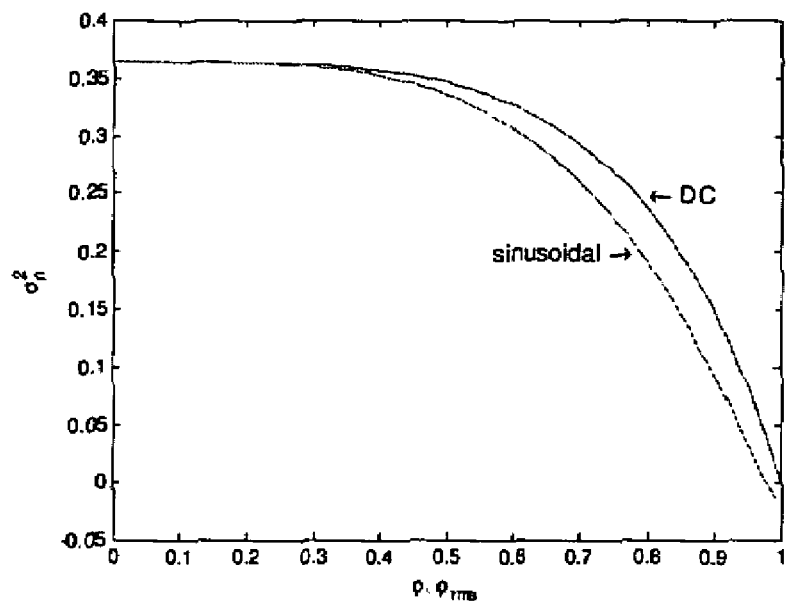
FIGS. 10A and 10B are graphical representations of the quantized noise power and the quantizer noise gain as a function of the input level for a DC and a sinusoidal input.
Figure 10B:
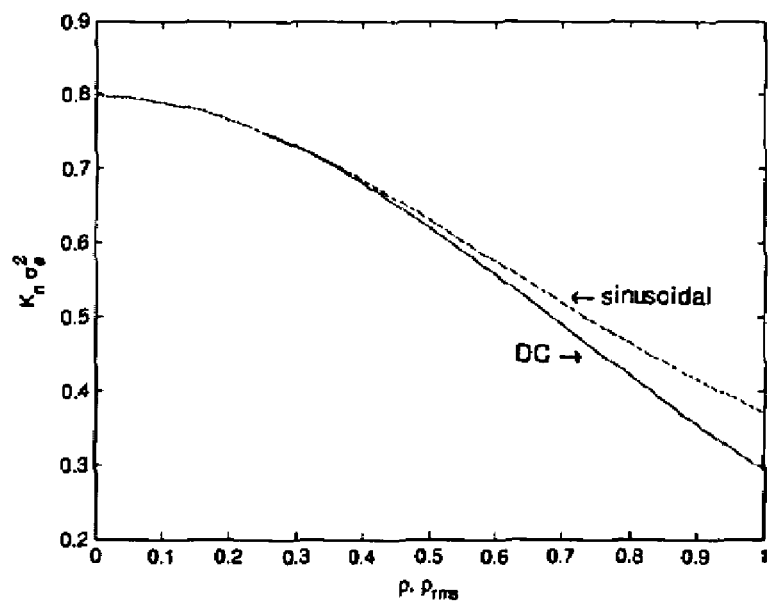

This result is very similar to the result found at DC, with a slight difference due to the Bessel function, as shown in FIG. 10A and FIG. 10B.

Another way to approach the problem is to use a quasi-stationary assumption, based on the fact that the sinusoidal signal frequency is much lower than the sampling frequency, as for high OSR values. In that situation, the sinusoid is interpreted as a slowly varying mean value and the analysis at DC is assumed to be still valid.

The extra input representing the quantization noise may be used in the model because the system is a DT system. If there was no sampling mechanism, the system could be set to a LC where all the harmonics are multiple of the fundamental and will be in general filtered by the loop filter, similar to what happens in a Colpitts oscillator. However, the presence of a sampling mechanism complicates things.

Assume that the system could settle in a sinusoidal LC, which generally is in the vicinity of the IB frequency range. Unless the ratio between the system sampling frequency is an integer multiple of the LC frequency, the DT limiting process generates subharmonics that can fall in the IB region. These subharmonics are not get attenuated by the loop filter and then the filter hypothesis of the sinusoidal DF cannot be applied, and the linear system should have multiple DFs, one for each subharmonic that is free to flow through the feedback loop.

Moreover, if the ratio between the sampling frequency and the LC frequency is an irrational number, these subharmonics can generate other subharmonics that are free to flow through the feedback loop. The result is that the possible LC of the loop is actually an aperiodic signal composed by a large number of frequency components, that cannot be treated with sinusoidal DF and that look very similar to noise. Thus the natural approach is to treat them as noise and use the DF theory on random signals.

The result at the output of the DSM is a spectrum where the subharmonics that can flow through the loop are attenuated because of the high loop gain, while their harmonics are not attenuated.

The maximum amplitude of the input signal for which a DSM is stable is a function of frequency. More explicitly, there are critical ranges of frequencies in which some resonance phenomena are present and the maximum allowed amplitude value reduces dramatically. As explained above, this fact can be a problem in radio receivers, because an interferer can lay in one of these frequencies and make the DSM go unstable. Thus these ranges may be discovered and eliminated (or at least mitigated). These resonance ranges lay around the transition bands of the loop filter, which corresponds to the transition bands of the NTF and the peaking regions of the STF, which are also close to the peaking region of the NTF.

Consider a sinusoidal input to the DSM having a frequency in the resonance range. To analyze the problem, consider a sinusoid plus noise at the input of the quantizer. Nevertheless, if the DSM has a narrowband loop filter and the OSR is high enough, one can make a quasi-stationary assumption. The sinusoid is interpreted as a slowly varying mean value and the statistical approach may be applied only to the noise and not to the signal. In this way, the analysis at DC can be assumed to be still valid.

As discussed above, the values of the linearized quantizer gains and the added quantization noise is a function of the relative DSM input amplitude $\rho_x$. This was based on the assumption that at the frequency of interest the STF approached unity. Unfortunately, this is not the case in the frequency ranges when the STF is peaking. Hence a more general approach is to refer the above-mentioned quantities to the relative output amplitude $\rho_y$, i.e.,:

$$K_n = \sqrt{\frac{2}{\pi}} \cdot \frac{\Delta}{\sigma_e} e^{-\rho_e^2} \quad \text{[Eq. 49]}$$

$$K_x = \frac{\Delta}{m_e} \text{erf}(\rho_e) \quad \text{[Eq. 50]}$$

$$\sigma_n^2 = \Delta^2 \cdot \left[ 1 - \rho_y^2 - \left(\frac{2}{\pi}\right) e^{-2(\text{erf}^{-1}\rho_y)^2} \right] \quad \text{[Eq. 51]}$$

where:

$$\rho_e = \text{erf}^{-1}(\rho_y) \quad \text{[Eq. 52]}$$

$$\rho_y = \frac{m_y}{\Delta} \quad \text{[Eq. 53]}$$

and $m_y$ can represent the DC component of the output or, for the sinusoidal case, the RMS amplitude of the (slowly varying) fundamental component of the output.

For the general sinusoidal case, still in the quasi-stationary assumption, it will be:

$$K_x = \frac{m_y}{m_e} = |STF_{K_s}(e^{j2\pi f/f_s})| \cdot \frac{m_x}{m_e} \quad \text{[Eq. 54]}$$

Thus, the linearized gain and noise as a function of the input can be obtained by substituting:

$$\rho_y = |STF_{K_x}(e^{j2\pi f/f_s})| \cdot \rho_x \quad \text{[Eq. 55]}$$

$$\rho_e = \text{erf}^{-1}(|STF_{K_x}(e^{j2\pi f/f_s})| \cdot \rho_x) \quad \text{[Eq. 56]}$$

Figure 11:
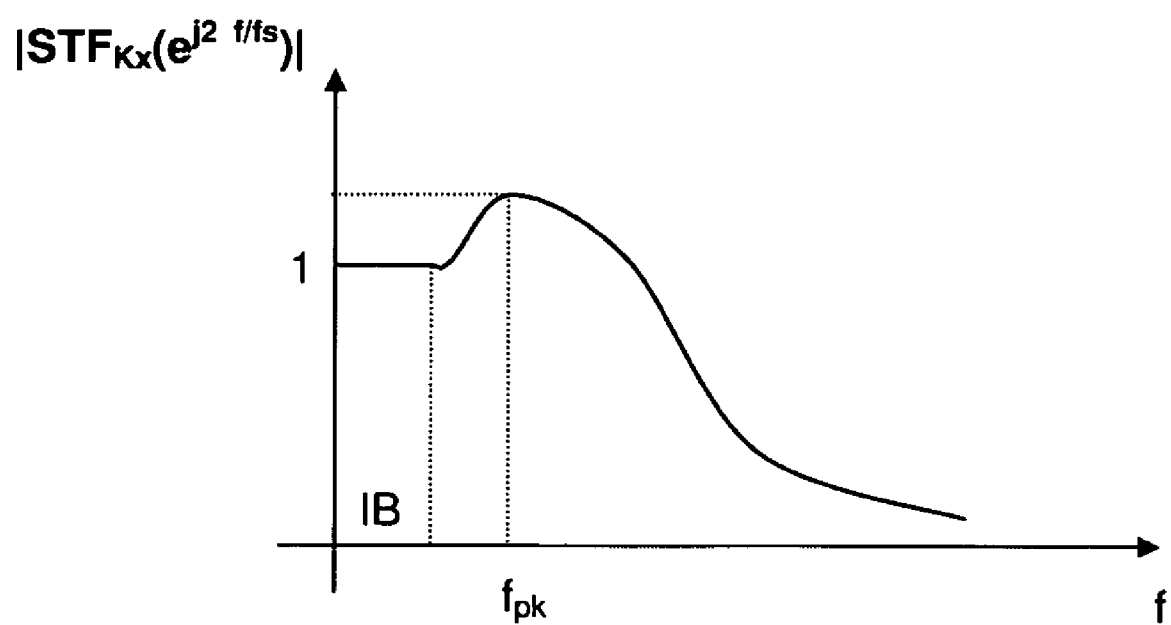
FIG. 11 shows a typical STF of a high-order interpolative DSM.

FIG. 11 shows a typical STF of a high-order interpolative DSM. It can be noted that the most critical point is at $f=f_{pk}$, where the magnitude of the magnitude of the STF reaches its maximum value $\alpha$. In that case we have:

$$\rho_y = \alpha \cdot \rho_x \qquad [\text{Eq. 57}]$$

$$\rho_e = \text{erf}^{-1}(\alpha \cdot \rho_x) \qquad [\text{Eq. 58}]$$

$$K_n = \sqrt{\frac{2}{\pi}} \cdot \frac{\Delta}{\sigma_e} e^{-(\alpha \cdot \rho_x)^2} \qquad [\text{Eq. 59}]$$

$$\sigma_n^2 = \Delta^2 \cdot \left[1 - (\alpha \cdot \rho_x)^2 - \frac{2}{\pi} e^{-2 \cdot (\text{erf}^{-1}(\alpha \cdot \rho_x))^2}\right] \qquad [\text{Eq. 60}]$$

Figure 12A:
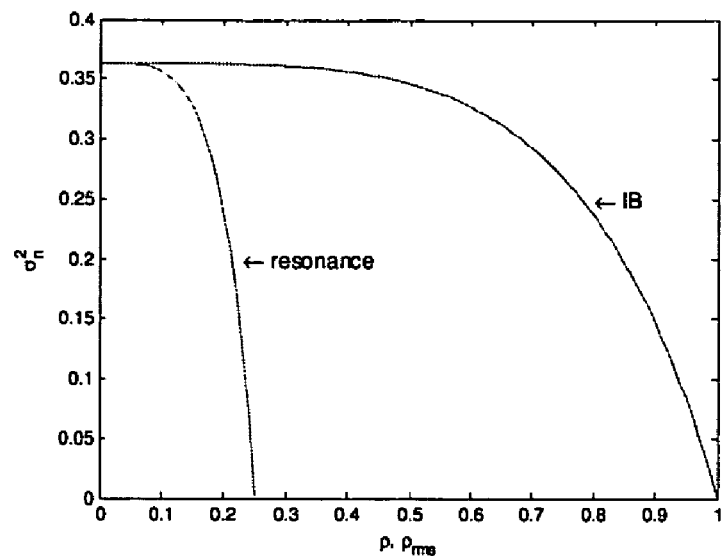
FIGS. 12A and 12B are graphical representations of the quantized noise power and the quantizer noise gain as a function of the input level for a sinusoidal input at two different frequencies.
Figure 12B:
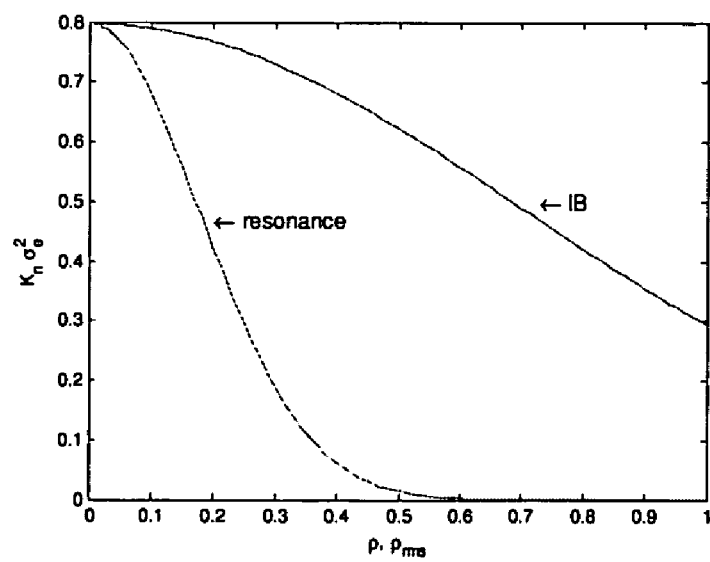

Thus for $f=f_{pk}$ the instability condition is reached for a DSM relative input level $\alpha$ times smaller than the level that would be reached for an IB signal. In fact, as can be observed from FIG. 12B, the linearized quantizer noise gain reduces much faster as the DSM input signal increases. This effect is partially mitigated by the fact that the added noise $\sigma_n^2$ also reduces faster (FIG. 12A).

Another thing to consider is the fact the STF varies by compressing the gain $K_x$, i.e., by increasing the relative input amplitude $\sigma_x$. The effect is an increasing of the peaking. But, as noted above, $K_x$ varies much slower than $K_n$, such that for a first-order analysis the STF shape can be considered unchanged.

To summarize, in the frequency ranges where the STF magnitude peaks above 1, for the same input amplitude there is a higher output amplitude, which corresponds to a smaller quantizer gain. In other words, the quantizer gain critical value is reached at a lower input amplitude level. This means that to reduce the probability of having the DSM go unstable at these critical frequencies, a loop filter may be designed with limited STF peaking.

A loop filter that limits the peaking of the STF also produces an NTF that is much smoother. Unfortunately, a smoother NTF means a weaker shaping of the noise and a higher quantization noise, and in general a reduced maximum SNR, even if the maximum signal amplitude is higher.

As described above, to avoid losing data, the DSM may be prevented from being unstable. In the case that it does, an instability recovery procedure may be implemented. In some applications, in which DSM instability cannot be tolerated, a DSM design may be implemented that does not go unstable in any condition.

Instability is characterized by a long string of consecutive 1's or 0's. In some implementations, instability can be detected with a counter with a carry which, when generated can be used as a DSM overload flag. This overload flag can be used to reset the state variables.

In other implementations, instability can be detected as above and the overload flag can be used to dynamically reduce the order of the DSM. In fact, a lower order DSM has in general a better behavior in terms of stability. Moreover, a pre-instability condition can also be detected and the order reduced before the DSM goes unstable.

In still other implementations, the state variables may be hard limited. For example, clamps are introduced across integrating capacitors to limit their swing before an instability condition is reached. A clamped integrator is basically out of the loop, so this technique has an equivalent effect as reducing the DSM order.

Alternately, the state variables can be soft limited. For example, a pre-instability condition can be detected and a progressive integrator gain reduction is applied. Instability may also be avoided by limiting the DSM input. Further the NTF is heuristically designed to improve DSM robustness in such a way that the instability is triggered at higher input amplitudes. The effect is an increase of the quantization noise. Of course, some of these instability countermeasures can be combined.

In various embodiments, DSM robustness may be improved to avoid DSM instability in any possible input condition, including resonance conditions. The methodology is described in the following steps.

The maximum input signal that can be present at the DSM input, over the whole frequency spectrum, may be determined. In general, this will be determined by the circuit in front of the DSM. For example, in an implementation for a radio receiver such as that shown above in FIGS. 1A-1C, the value of the output of PGA 176 may correspond to the maximum input signal. Based on the maximum input signal, the maximum STF peaking that can be incurred without causing instability is calculated. In some embodiments, this peaking value may be calculated in accordance with a signal transfer function analysis such as that shown in FIG. 11. Then the corresponding equivalent loop filter that optimizes the NTF but limits the STF peaking under the maximum value, is designed. Specifically, a filter may be synthesized according to a mask corresponding to the STF.

This loop filter design thus corresponds to a maximum achievable SNR that is lower than in the optimal design case, but the DSM never goes unstable.

In a mobile environment where a continuous radio signal, like FM or AM broadcasting, is to be received, short-term interruptions are not generally tolerable and thus a DSM in accordance with one embodiment may be implemented. In a modem mixed-signal receiver, like a direct-conversion or low-IF receiver, the signal is converted by an ADC and the baseband processing (demodulation, decoding, etc.) is done in the digital domain by a DSP.

In many implementations the ADC can be a high-order interpolative 1-bit DSM for its characteristic of high linearity and simplicity of implementation, and due to its robustness to component variations and matching. Unfortunately, this kind of ADC can become unstable for certain kind of input conditions. In particular, instability is trigger by high amplitude input signals (i.e., overloading). Moreover, the DSM stability is more sensitive in certain frequency ranges, i.e., can be triggered by a much lower signal amplitude.

In various embodiments, the use of a low-IF or direct-conversion architecture may be motivated by a minimization of the analog front-end circuitry to optimize cost (i.e., die area), power consumption and system performance. Hence the inclusion of a strong filter to eliminate the critical interferers is not a viable choice. Accordingly, the DSM may be designed to "unconditionally" tolerate all input conditions.

If all the possible input conditions are known, it is possible to design a loop filter that prevents instability. This is done by limiting the peaking of the STF and by so doing, the amplitude of the components of the output signal. The trade-off is that such an "unconditionally" DSM has a maximum SNR that is lower than that achievable with an optimal design, but the optimal design is highly prone to instability.

Figure 13:
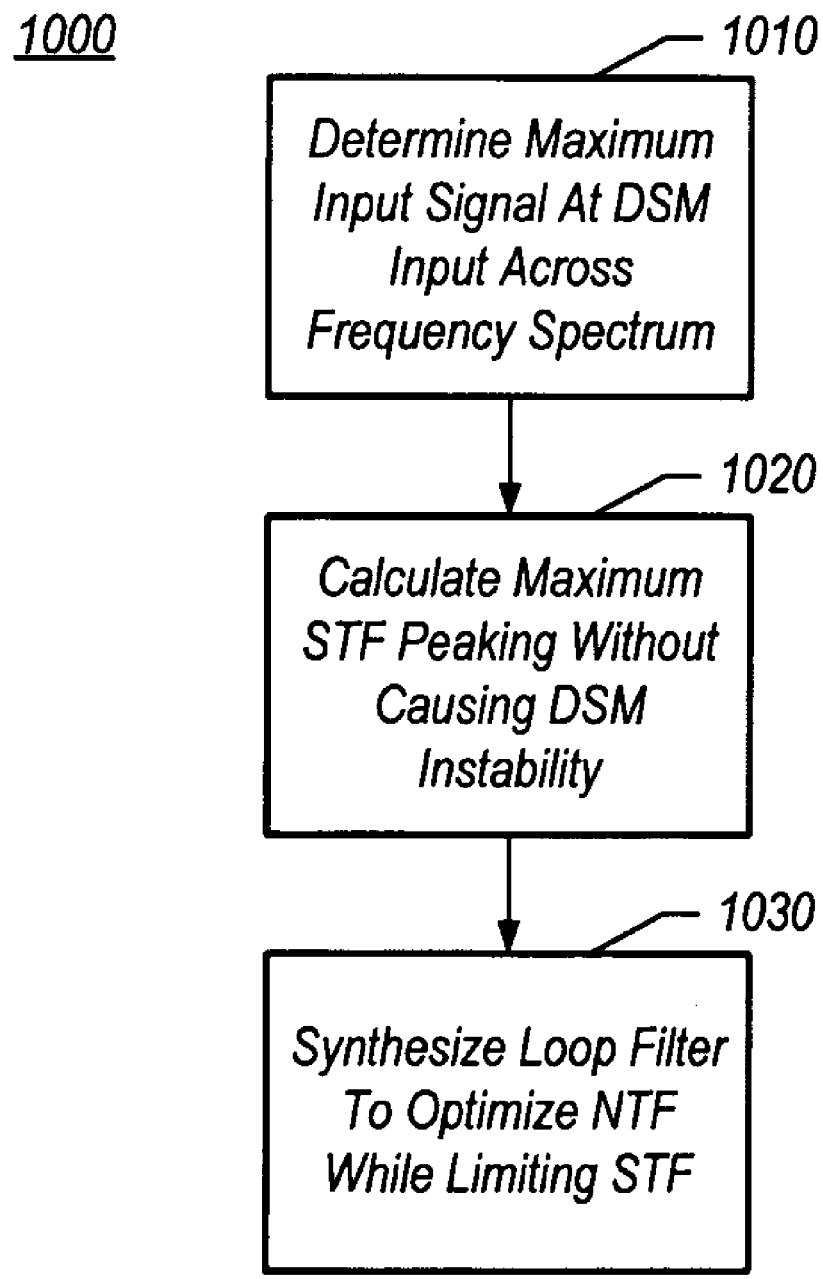
FIG. 13 is a flow diagram of a method in accordance with one embodiment of the present invention.

Referring now to FIG. 13, shown is a flow diagram of a method in accordance with one embodiment of the present invention. As shown in FIG. 13, method 1000 may be used to design an unconditionally stable loop DSM in accordance with an embodiment of the present invention. Method 1000 may begin by determining a maximum input signal at an input of a DSM to be implemented within a system across an entire frequency spectrum for which the system is used (block 1010). For example, during design of a wireless receiver, which may be a radio receiver, cellular receiver or the like, various front-end analog blocks, such as different amplifiers, gain blocks, antenna components, and the like may be analyzed, along with the known type of system to determine the maximum input signal that could be provided to a DSM. Furthermore, this maximum input signal may also be measured across the entire frequency spectrum at which the device will operate. This frequency spectrum may vary in different embodiments.

Still referring to FIG. 13, next a maximum STF peaking may be calculated. More specifically, this STF peaking may be calculated such that the DSM does not go unstable under any input condition (block 1020). Based on this information, a loop filter can be synthesized having an optimized noise transfer function, while the signal transfer function may be limited (block 1030). Accordingly, such a design may limit the loop filter's signal-to-noise ratio from a maximum possible value to avoid instability, regardless of input signal conditions.

Figure 14:
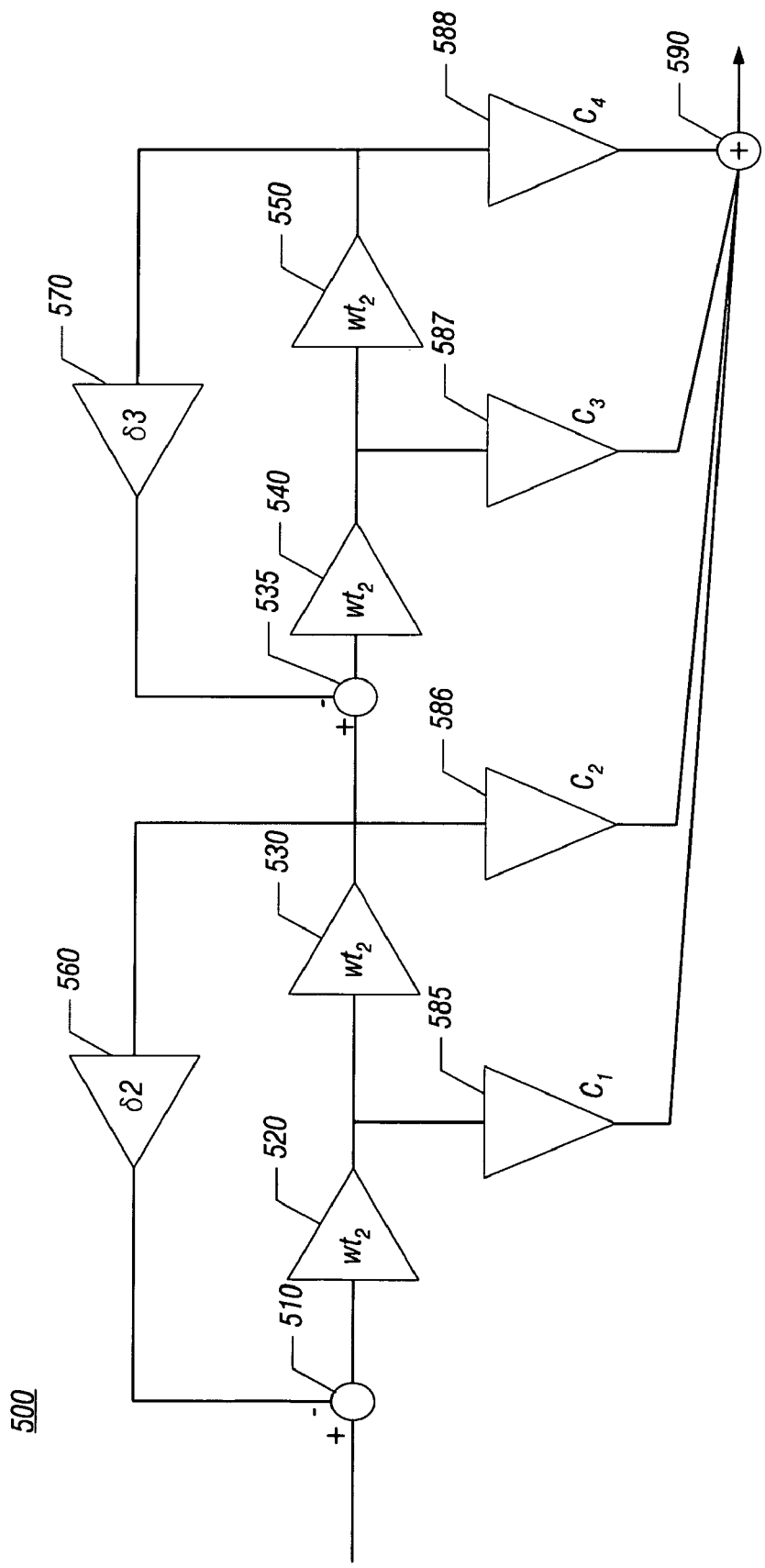
FIG. 14 is a block diagram of a loop filter in accordance with one embodiment of the present invention.

Using such a method, various loop filters may be designed. Such loop filters may be high-order interpolating-type filters for incorporation into a DSM. Referring now to FIG. 14, shown is a block diagram of a loop filter in accordance with one embodiment of the present invention. As shown in FIG. 14, loop filter 500 may be a high-order loop filter including four integration stages coupled in series, namely integration stages 520, 530, 540 and 550. An input signal into loop filter 500, which may be provided from an analog front-end of a wireless receiver, is received at a summer 510, which also receives a feedback signal from a first feedback integrator 560. The summed signal is provided to first integrator 520, the output of which is provided to second integrator 530. In addition, the output of integrator 520 is tapped and multiplied by a coefficient 585 and is provided to a summing node 590. Similarly, the output of second integrator 530 is tapped and multiplied by a second coefficient 586, which is also applied to summing node 590.

Furthermore, the output of second integrator 530 is coupled in a feedback loop through first feedback integrator 560 to summer 510. Still further, the output of second integrator 530 is coupled to another summer 535, which is further coupled to receive an output of a second feedback integrator 570. The summed signal from summer 535 is provided to a third integrator 540, which then passes its output to fourth integrator 550. Furthermore, the output of integrator 540 is multiplied by a third coefficient 587 and is provided to summing node 590, along with the output of fourth integrator 550, which is multiplied by a fourth coefficient 588 and is provided to summer 590. In turn, the output of fourth integrator 550 is also coupled to second feedback integrator 570. The summed signal from summing node 590 may be provided to a comparator of the DSM.

While different values for the integrators and coefficients of loop filter 500 may be implemented, in one embodiment, values may differ in a first system which favors maximum STF over stability and a second system that favors stability (i.e., an unconditionally stable DSM).

Different architectures for a loop filter that provide unconditional stability in accordance with an embodiment of the present invention may also be implemented. For example, in some implementations a complex loop filter may be implemented to handle quantization of in-phase and quadrature-phase signals that is, complex I and Q signals. In such an implementation, a similar architecture as that shown in FIG. 14 may be present for the quadrature phase, and the two loop filter paths may be coupled to each other in a feedback arrangement to handle the complex calculations based on the input signal.

Following is a Table 1 of acronyms used herein:

TABLE 1

| | |
|---|---|
| AAF | Anti-Alias Filter |
| ADC | Analog-to-Digital Converter |
| AGC | Automatic Gain Control |
| BW | Bandwidth |
| CT | Continuous-Time |
| DF | Describing Function |
| DR | Dynamic Range |
| DSM | Delta-Sigma Modulator |
| DSP | Digital Signal Processor |
| DT | Discrete-Time |
| FM | Frequency Modulation |
| GM | Gain Margin |
| IB | In-Band |
| IF | Intermediate Frequency |
| IM | Inter-Modulation |
| LC | Limit Cycle |
| LNA | Low-Noise Amplifier |
| LPF | Low-Pass Filter |
| MSE | Mean Sequence Error |
| NL | Non-Linear |
| NTF | Noise Transfer Function |
| OOB | Out-Of-Band |
| OSR | Oversampling Ratio |
| PDF | Probability Density Function |
| PGA | Programmable Gain Amplifier |
| PM | Phase Margin |
| RF | Radio Frequency |
| RSSI | Radio Signal Strength Indicator |
| SNR | Signal-to-Noise Ratio |
| STF | Signal transfer Function |

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A delta-sigma modulator comprising:
   a complex loop filter coupled to recieve an incoming signal, wherein the incoming signal comprises in-phase and quadrature-phase signals, the complex loop filter having a plurality of integration stages, the complex loop filter designed to have a signal transfer function constrained to be below a maximum signal transfer function peak that can be incurred at a predetermined maximum value of the incoming signal without causing instability the delta-sigma a modulator, and
   a quantizer coupled to the complex loop filter to receive an output of the complex loop filter and to generate quantized output.

2. The delta-sigma modulator of claim 1, wherein the signal function is further constrained to maintain the stability regardless of a frequency of the incoming signal.

3. The delta-sigma modulator of claim 1, wherein the incoming signal is obtained from a continuous time broadcast signal.

4. The delta-sigma modulator of claim 1, wherein the delta-sigma modulator is unconditionally stable for any incoming signal of a system including the delta-sigma modulator.

5. The delta-sigma modulator of claim 4, wherein the system comprises a wireless system including a radio receiver.

6. The delta-sigma modulator of claim 1, wherein the delta-sigma modulator comprise a high-order one-bit interpolative delta-sigma modulator.

7. A method comprising:
determining a maximum input signal across a frequency spectrum to be provided to an input of a delta-sigma modulator (DSM);
calculating a maximum signal transfer function peaking value that the DSM can incur without instability; and
synthesizing a loop filter of the DSM to limit signal transfer function peaking below the calculated maximum signal transfer function peaking value.

8. The method of claim 7, further comprising synthesizing the loop filter of the DSM to optimize a noise transfer function.

9. The method of claim 8, wherein synthesizing the loop filter comprises determining filter components from a mask of the signal transfer function.

10. The method of claim 7, further comprising determining the maximum input signal based on a continuous time broadcast radio signal to be received by a mobile radio receiver including the DSM.

11. The method of claim 7, further comprising determining a gain of a quantizer of the DSM as a function of an amplitude of an output of a quantizer.

12. The method of claim 11, further comprising referring the output amplitude of the DSM to an input value for the signal transfer function.

13. A system comprising:
an analog front-end to receive an incoming radio frequency (RF) signal;
an analog-to-digital converter (ADC) having an input coupled to receive the incoming RF signal from the analog front-end, the ADC to convert the incoming radio frequency signal into a digital representation, wherein the ADC comprises a delta-sigma modulator (DSM) having a loop filter with a plurality of integrators and coefficients associated therewith, wherein the DSM is stable at a predetermined maximum value for the incoming RF signal, the loop filter having a limited signal transfer function that is below a maximum signal transfer function peak for the predetermined maximum value, wherein the maximum signal transfer function peak does not cause instability of the DSM, wherein values of the plurality of integrators and the coefficients limit the signal transfer function to be below the maximum signal transfer function peak.

14. The system of claim 13, further comprising a digital signal processor (DSP) coupled to receive the digital representation and process the digital representation.

15. The system of claim 14, wherein the analog front-end, the ADC, and the DSP are integrated on a single substrate of an integrated circuit (IC).

16. The system of claim 13, wherein the ADC comprises a complex converter to convert in-phase and quadrature-phase information of the incoming RF signal.

17. The system of claim 13, wherein the loop filter has an optimized noise transfer function.

* * * * *

UNITED STATES PATENT AND TRADEMARK OFFICE
CERTIFICATE OF CORRECTION

PATENT NO. : 7,321,324 B2 Page 1 of 1
APPLICATION NO. : 11/270908
DATED : January 22, 2008
INVENTOR(S) : Alessandro Piovaccari It is certified that error appears in the above-identified patent and that said Letters Patent is hereby corrected as shown below:

Column 22:
Line 53, "the delta-sigma a modulator" should be --of the delta-sigma modulator--.

Column 22:
Line 59, "signal function" should be --signal transfer function--.

Signed and Sealed this

Thirteenth Day of May, 2008

JON W. DUDAS
*Director of the United States Patent and Trademark Office*